(12) United States Patent
Augusto

(10) Patent No.: US 8,120,079 B2
(45) Date of Patent: Feb. 21, 2012

(54) LIGHT-SENSING DEVICE FOR MULTI-SPECTRAL IMAGING

(75) Inventor: Carlos J. R. P. Augusto, San Jose, CA (US)

(73) Assignee: Quantum Semiconductor LLC, San Jose, CA (US)

( * ) Notice: Subject to any disclaimer, the term of this patent is extended or adjusted under 35 U.S.C. 154(b) by 0 days.

(21) Appl. No.: 12/403,900

(22) Filed: Mar. 13, 2009

(65) Prior Publication Data

US 2009/0173976 A1 Jul. 9, 2009

Related U.S. Application Data

(63) Continuation-in-part of application No. 11/070,721, filed on Mar. 2, 2005, now Pat. No. 7,521,737, which is a continuation of application No. PCT/EP03/10346, filed on Sep. 15, 2003.

(60) Provisional application No. 60/412,139, filed on Sep. 19, 2002.

(51) Int. Cl.
*H01L 33/00* (2010.01)

(52) U.S. Cl. ........ 257/292; 257/233; 257/184; 257/186; 257/438; 257/440; 257/444; 257/465; 257/466; 257/E31.063; 257/E33.053

(58) Field of Classification Search .................. 257/292, 257/233, 184, 186, 438, 440, 444, 465, 466, 257/E31.063, E33.053
See application file for complete search history.

(56) References Cited

U.S. PATENT DOCUMENTS

| 5,187,553 A | * | 2/1993 | Makita ..................... 257/187 |
| 5,625,729 A | | 4/1997 | Brown |
| 6,943,051 B2 | | 9/2005 | Augusto et al. |

FOREIGN PATENT DOCUMENTS

WO 0233755 4/2002

OTHER PUBLICATIONS

XP000005661—Apr. 1, 1988—Aubert et al—entitled "Monolithic Optical Position Encoder with On-Chip Photodiodes"—9 pages—I.E.E.E. Journal of Solid State Circuits, vol. 23, No. 2.
XP006012681—Sep. 16, 1999—Heide, et al.—entitled "Monolithic CMOS Photoreceivers for short-range optical data communications"—3 pages.
XP000362935—Mar. 1, 1993—Noriyoshi, et al—entitled An Integrated Photodetector—Amplifier Using a-Si p-i-n Photodiodes and Poly-Si Thin-Film Transistors—IEEE Photonics Technology Letters.

* cited by examiner

*Primary Examiner* — Long Pham
(74) *Attorney, Agent, or Firm* — Sturm & Fix LLP

(57) ABSTRACT

A method of fabricating multi-spectral photo-sensors including photo-diodes incorporating stacked epitaxial superlattices monolithically integrated with CMOS devices on a common semiconductor substrate.

20 Claims, 20 Drawing Sheets

LIGHT-SENSING DEVICE FOR MULTI-SPECTRAL IMAGING

CROSS-REFERENCE TO RELATED APPLICATIONS

This application is a continuation-in-part of U.S. patent application Ser. No. 11/070,721, filed Mar. 2, 2005, which is a Continuation application of PCT/EP2003/010346 filed Sep. 15, 2003, claiming priority of U.S. Patent Application No. 60/412,139 filed Sep. 19, 2002, which are incorporated by reference herein in their entirety.

BACKGROUND OF THE INVENTION

The present invention relates to multi-spectral image sensing, and in particular to the monolithic integration with CMOS of light-sensing devices tailored for different spectral ranges, such as UV, Visible, SWIR, MWIR, LWIR, etc.

Co-pending patent application Ser. No. 11/070,721 introduced a method of fabricating, on the same substrate and monolithically integrated with CMOS, light-sensing devices capable of covering different portions of the electromagnetic spectrum, as shown in FIGS. 1A and 1B (Prior Art). Both types of devices comprise the same set of epitaxially layers, with in-situ doping and bandgap engineering, grown on separate active areas with complementary doping polarities.

A first device type, the PIN type, is a two-terminal device wherein a first electrode is p-type doped, and a second electrode is n-type doped, with an undoped or lowly doped between the two electrodes, forming a P-I-N structure. In PIN devices light is absorbed mainly through band-to-band transitions of charge carriers.

A second device type, the HIP type, is also a two-terminal device wherein the two electrodes are doped with impurities of the same type, forming wither P-I-P or N-I-N structures. In HIP devices, light is absorbed mainly through transitions within the same band (within the conduction band or within the valence band), wherein the energy levels may be quantized or not. Examples of such devices with quantized energy levels are Quantum Well Infrared Photodetectors (QWIP), and examples of devices without quantized are Heterojunction Internal Photoemission (HIP) devices.

The epitaxially grown layers comprise a region of undoped or lowly doped layers, and a region that is an electrode of the light-sensing devices. For epitaxial layers with in-situ p-type doping, the films grown on n-type active areas form P-I-N structures, and the same films grown on p-type active areas form P-I-P structures. For epitaxial layers with in-situ n-type doping, the films grown on p-type active areas form P-I-N structures, and the same films grown on n-type active areas form N-I-N structures.

The ranges of wavelengths absorbed by either type of device depend on the details of the in-situ doping and bandgap engineering of the epitaxial layers. When using SiGeC-based epitaxial films, the band structure of the light-absorbing layers is determined by the amount of Ge and C, and the atomic-level ordering of the incorporation of said elements. Said band structure determines the ranges of wavelengths possible to absorb in each type of device. Bandgap engineering and doping profile engineering of the light-absorbing layers, can also be used to place photo-generated carriers under a built-in drift field, which is crucial to insure a highly efficient charge collection and readout processes.

Said co-pending application Ser. No. 11/070,721 provided several exemplary implementations using different types of substrates, bulk and SOI, and for image sensors having front-side illumination as well as for image sensors having backside illumination, as shown in FIGS. 2A and 2B (Prior Art). As depicted in this exemplary implementation, at the opposite end from which light is coupled into the device, the junction/electrode can be a Schottky junction.

In addition, both types of devices can have an avalanche region placed between their top and bottom electrodes, thereby providing a built-in gain mechanism, which can be bandgap engineered as shown FIGS. 3A and 3B (Prior Art).

Co-pending patent application Ser. No. 11/070,721 also introduced a method of fabricating Heterojunction Integrated Thermionic (HIT) coolers, with the light-sensing layers, through the same epitaxial growth step. The HIT layers can be grown before or after the layers for light-sensing, leading to different integration and interconnecting schemes, as shown in FIG. 4A (Prior Art).

In addition, both types of devices can have an energy-filtering and/or momentum-filtering region placed between their top and bottom electrodes, as shown FIG. 5 (Prior Art), as described in WO/2006/010618.

SUMMARY OF THE INVENTION

It is an object of the present invention to provide a method of fabricating multi-spectral photo-sensors including photo-diodes incorporating stacked epitaxial superlattices monolithically integrated with CMOS devices on a common semiconductor substrate.

Another object of the invention is to provide a method of fabricating photo-detectors sensing light through miniband-to-minband transitions and intersubband transitions in superlattice absorbing layers, integrated with CMOS devices on a common semiconductor substrate and allowing the operational features of the devices to be tailored to suit wavelength sensing requirements.

Yet another object of this invention is to provide a method of fabricating photo-detectors wherein the same superlattice layers can absorb light through miniband-to-minband transitions when a certain bias condition is applied, or intersubband transitions when another particular bias condition is applied.

A further object of the invention is to provide a method of fabricating photo-detectors sensing light through miniband-to-minband transitions and intersubband transitions in superlattice absorbing layers, and allowing the photo-diodes to be operated under Avalanche and Geiger modes.

A further object of the invention is to provide a method of fabricating photo-detectors with an avalanche region capable of impact ionization at low voltage, through regions with narrow bandgaps and/or through the incorporation of doping impurities with energy levels deep in the gap of the host semiconductor.

A further object of this invention is to provide a method of fabricating multi-spectral photo-sensors including photo-diodes incorporating stacked epitaxial superlattices monolithically integrated with CMOS devices on a common semiconductor substrate, and wherein the superlattice light-absorbing layers are patterned into vertical nanowires.

A further object of this invention is to provide a method of fabricating multi-spectral photo-sensors including photo-diodes incorporating stacked epitaxial superlattices monolithically integrated with CMOS devices on a common semiconductor substrate, and wherein the light-absorbing layers and the avalanche multiplication layers are patterned into vertical nanowires.

A further object of this invention is to provide a method of fabricating thermal devices, monolithically integrated with the photo-diode layers and CMOS devices on a common semiconductor substrate, wherein said thermal devices can operate as a Heterojunction Integrated Thermionic cooler when a certain bias condition is applied, or as a thermoelectric power generating device, when another particular bias condition is applied, and thus generate electricity from the heat produced by CMOS devices.

According to the present invention, photo-diode devices sensing light through miniband-to-miniband transitions and intersubband transitions in superlattice absorbing layers, are simultaneously epitaxially grown on embedded well semiconductor regions implanted in a common semiconductor substrate, the devices for light-sensing through miniband-to-minband transitions being grown on surfaces having opposite doping polarities of the surfaces wherein the devices for light-sensing through intersubband transitions are grown.

With appropriate choice of substrate materials, device layers and heterojunction engineering and process architecture, it is possible to fabricate silicon-based and germanium-based multi-spectral sensors that can deliver pixel density and cost of fabrication comparable to the state of the art CMOS image sensors for the visible range. The present invention can be implemented with epitaxially deposited films on the following substrates: Silicon Bulk, Thick-Film and Thin-Film Silicon-On-Insulator (SOI), Germanium Bulk, Thick-Film and Thin-Film Germanium-On-Insulator (GeOI).

Photo-detector devices grown according to the invention are suitable for the realization of 1D and 2D arrays of Passive-Pixel Sensors (PPS), and also for the realization of 1D and 2D arrays of Active-Pixel Sensors (APS), in which each pixel has multi-wavelength (visible and invisible) sensing capability. Also, the invention permits to realize photo-sensing devices for front-side illumination as well as photo-sensing devices suitable for back-side illumination.

DETAILED DESCRIPTION OF THE INVENTION

Co-pending patent application Ser. No. 11/070,721 provided several exemplary energy band structure diagrams for the combined PIN and HIP devices, as well as several exemplary implementations for monolithic integration with CMOS. The present invention discloses new energy band structure diagrams to optimize the performance of the light-sensing devices, in particular for the HIP devices employed to absorb photons whose energy is smaller than the bandgap of the photo-diodes layers. It also discloses additional implementations for monolithic integration with CMOS in bulk substrates and "thick film" SOI substrates.

1. Implementation with Deep N-Well in Bulk Substrates

Figure 1A:
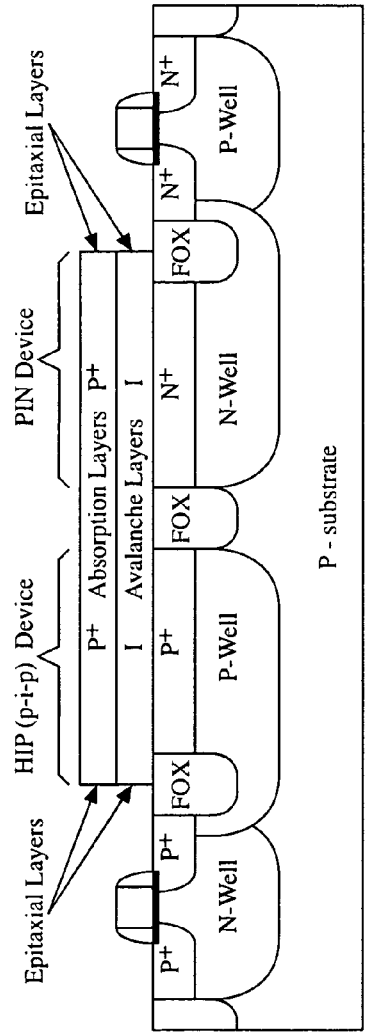
FIGS. 1A and 1B (Prior Art)—PIN and HIP light-sensing devices, capable of covering different portions of the electromagnetic spectrum, monolithically integrated with CMOS devices on bulk substrates.
Figure 1B:
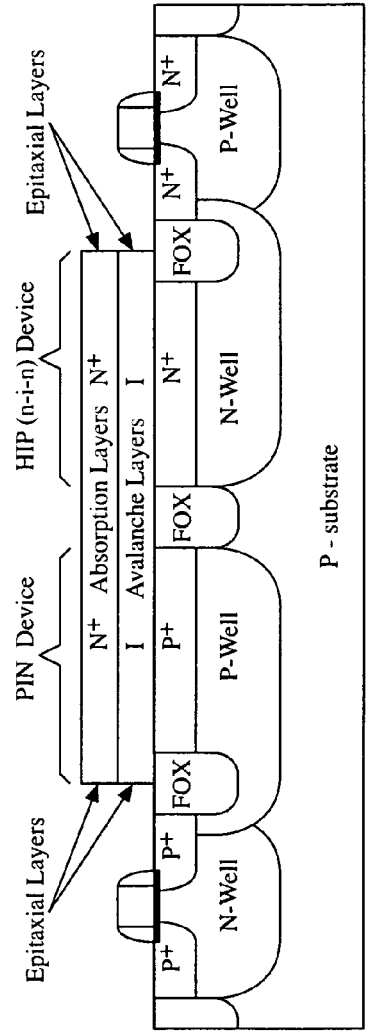
Figure 2A:
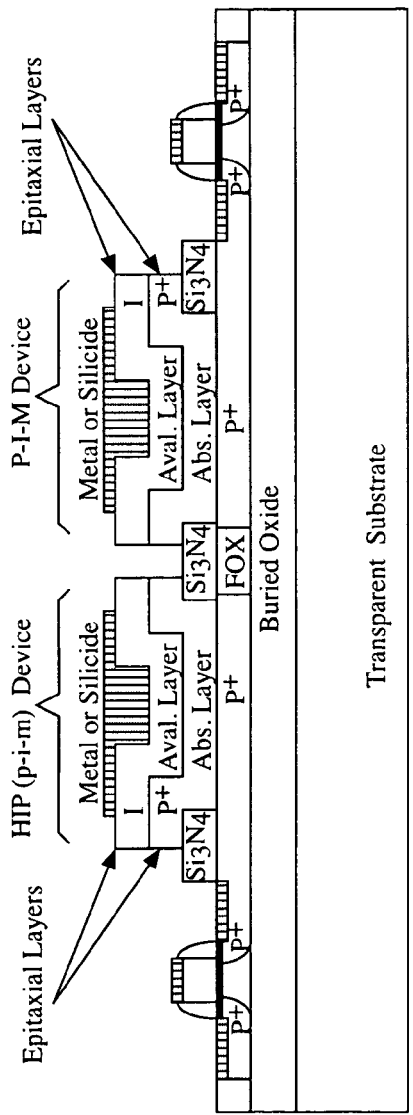
FIGS. 2A and 2B (Prior Art)—PIN and HIP light-sensing devices, capable of covering different portions of the electromagnetic spectrum, monolithically integrated with CMOS devices on Thin-Film SOI substrates, suitable for front-side and back-side illumination.
Figure 2B:
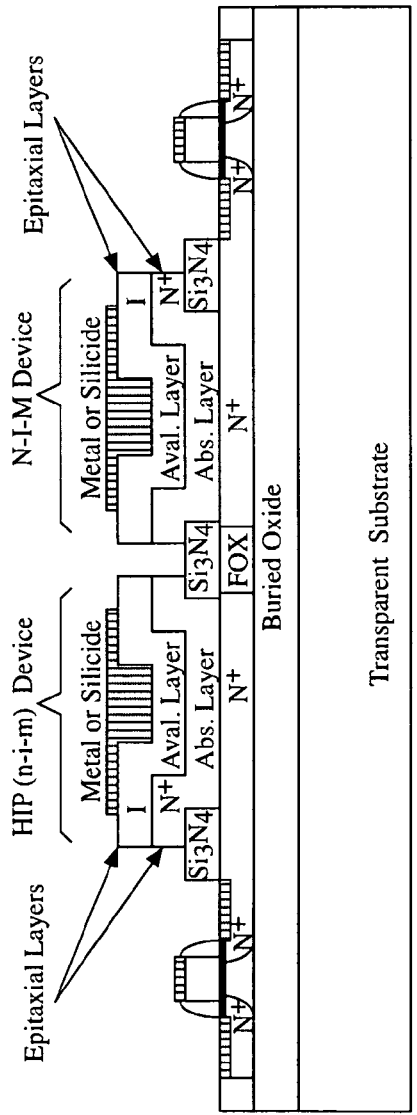
Figure 3A:
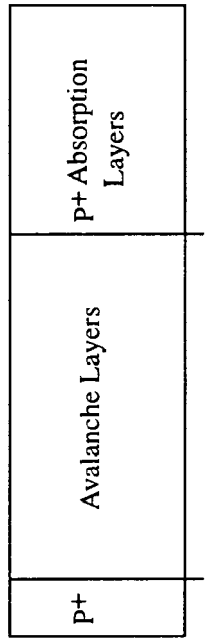
FIGS. 3A and 3B (Prior Art)—PIN and HIP light-sensing devices, capable of covering different portions of the electromagnetic spectrum, incorporating a bandgap engineered avalanche multiplication region.
Figure 3A:
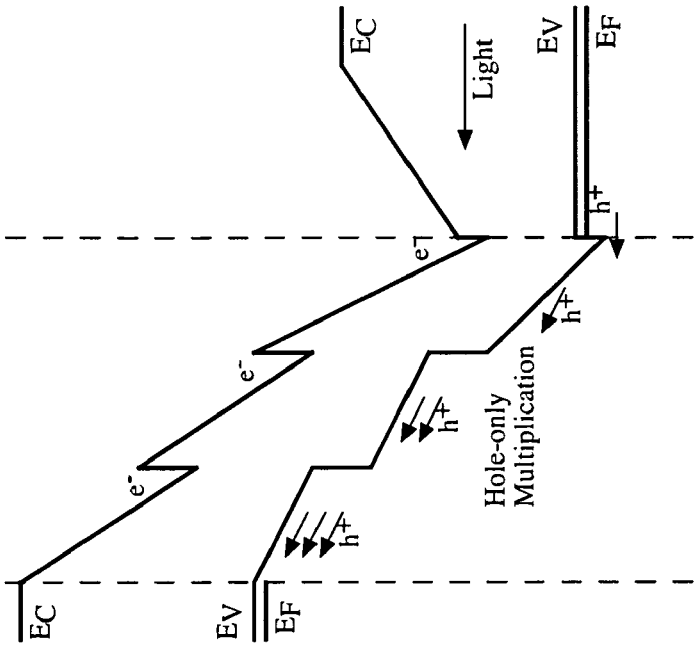
Figure 3B:
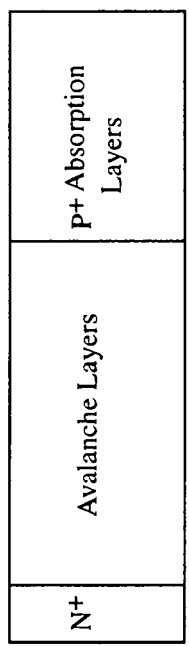
Figure 3B:
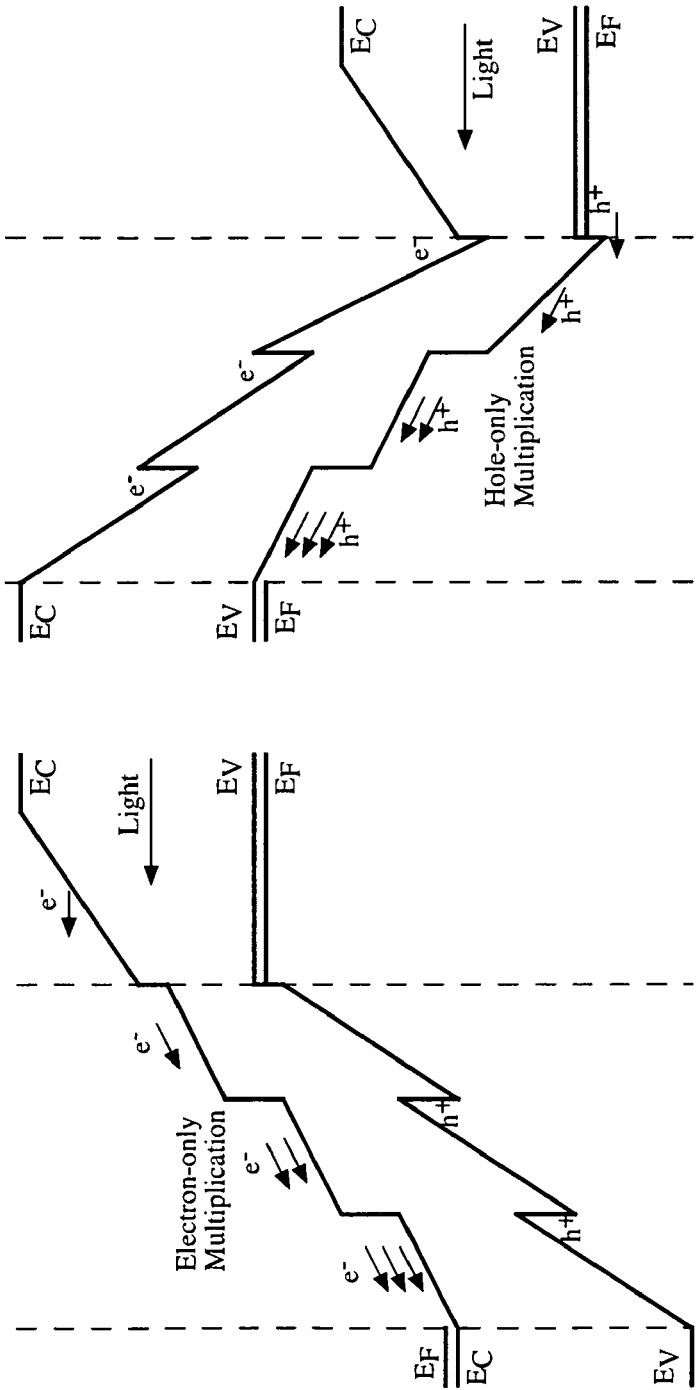
Figure 4:
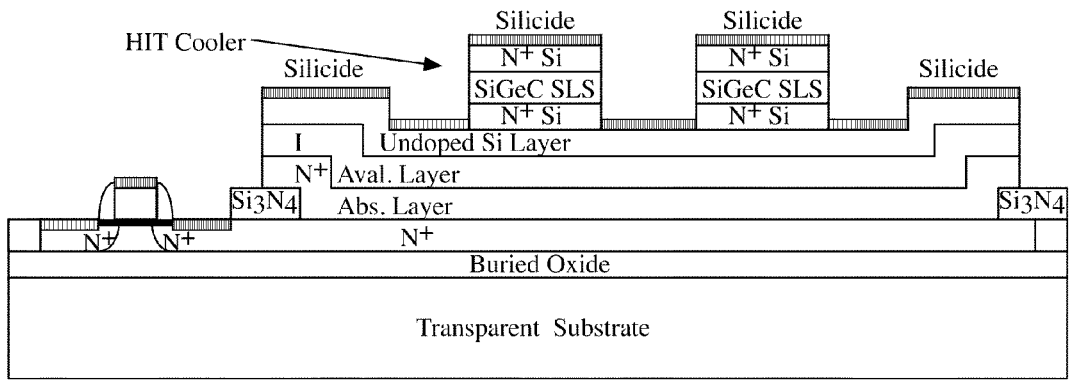
FIG. 4 (Prior Art)—PIN and HIP light-sensing devices, capable of covering different portions of the electromagnetic spectrum, incorporating a monolithically integrated Heterojunction Integrated Thermionic (HIT) cooling device.
Figure 5:
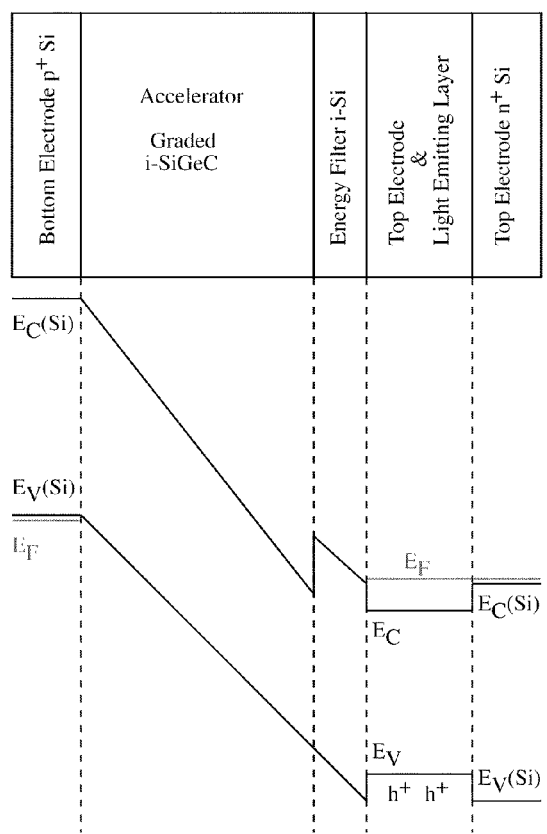
FIG. 5 (Prior Art)—PIN and HIP light-sensing devices, capable of covering different portions of the electromagnetic spectrum, incorporating bandgap engineered layers for energy and/or momentum filtering.
Figure 6A:
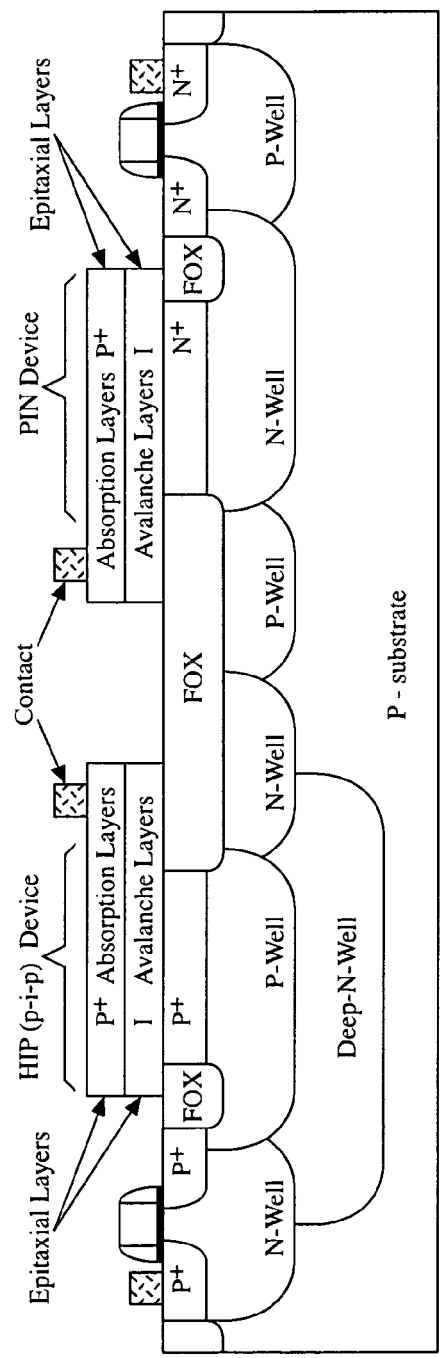
FIGS. 6A and 6B—PIN and HIP light-sensing devices, capable of covering different portions of the electromagnetic spectrum, monolithically integrated with CMOS devices on bulk substrates, wherein the CMOS wells, underneath light-sensing device layers, having the same polarity of the substrate, are electrical isolated from said substrate though deep wells.
Figure 6B:
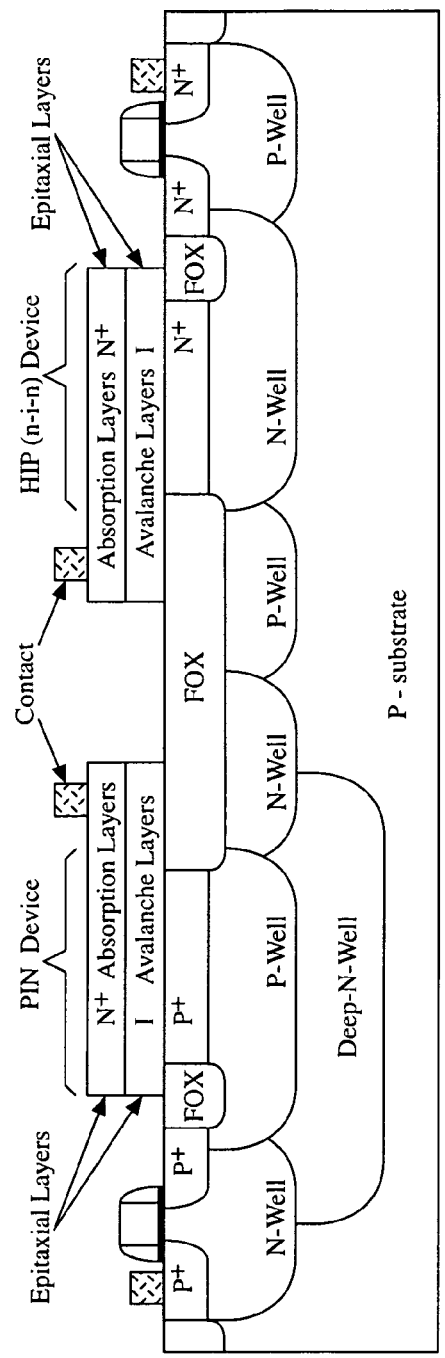

Regarding the monolithic integration of PIN & HIP devices with CMOS using bulk substrates, co-pending patent application Ser. No. 11/070,721 already provided exemplary cross-section views of such integration, in FIGS. 1, 2 (Prior Art), and derivatives such as FIGS. 5, 6, 7 and 8 (Prior Art). In this integration scheme, the N-Wells underneath the epitaxial layers are electrodes that are independently biased for each pixel. In said FIGS. 1, 2, 5, 6, 7 and 8 (Prior Art), the P-Wells are made on a P-Substrate, thereby making it impossible for said P-Wells to be independently biased for each pixel. This was an error that is obvious to solve for anyone skilled in the art, by simply isolating said P-Wells from the P-Substrate with a Deep N-Well, as it is shown in the current invention, in FIGS. 6A and 6B.

2. Implementation with Deep Trench Isolation in Thick-Film SOI Substrates

Figure 7A:
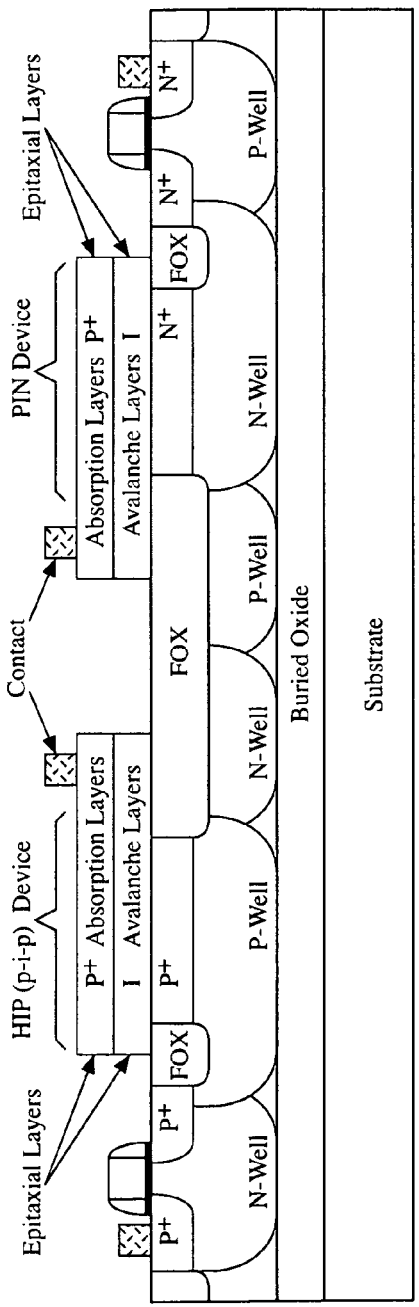
FIGS. 7A and 7B—PIN and HIP light-sensing devices, capable of covering different portions of the electromagnetic spectrum, monolithically integrated with CMOS devices on Thick-Film SOI substrates, wherein the CMOS wells, underneath light-sensing device layers, reach the buried oxide of said SOI substrate.
Figure 7B:
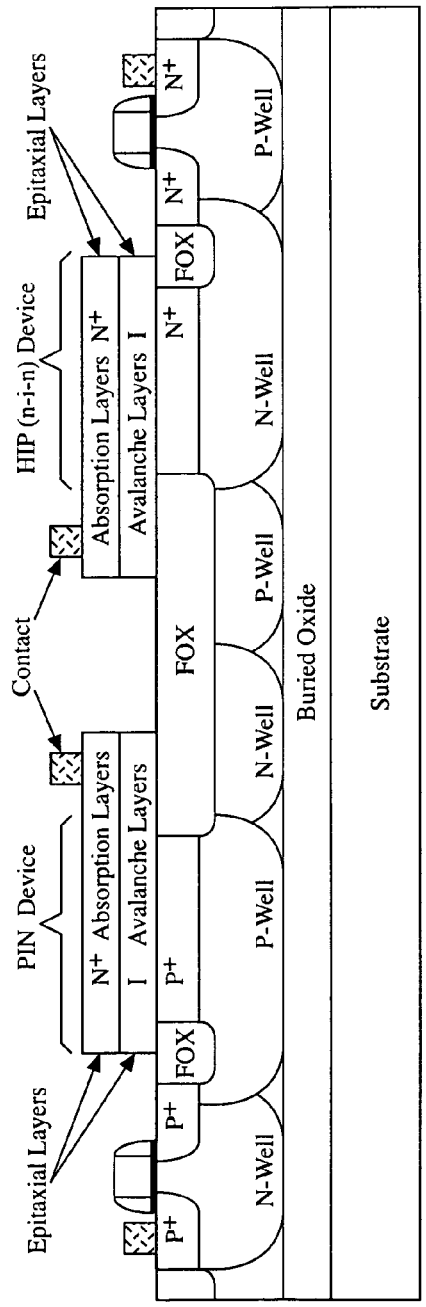

An alternative implementation that also decouples P-Wells from the substrate, but that does not change the overall CMOS device and integration architecture, is to use "thick film" Silicon-On-Insulator (SOI) substrates in which the ion-implanted P-Wells and N-Wells reach the buried oxide of the SOI substrate. This solution is shown in FIGS. 7A and 7B.

A further advantage of using SOI substrates, is that by using Deep Trench Isolation (DTI), it is possible to provide a dielectric isolation between adjacent pixels, thereby completely suppressing electrical crosstalk.

Figure 8A:
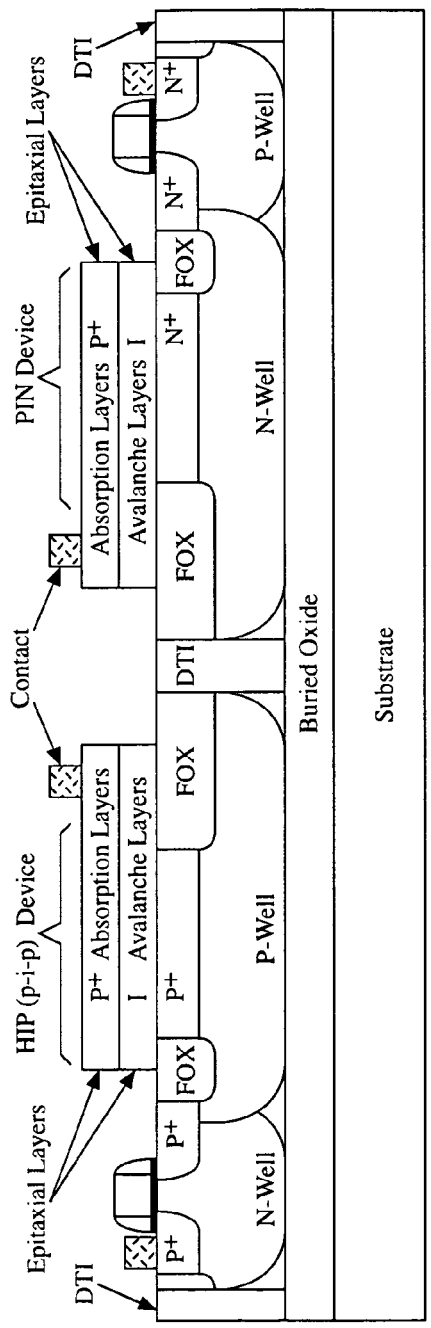
FIGS. 8A and 8B—PIN and HIP light-sensing devices, capable of covering different portions of the electromagnetic spectrum, monolithically integrated with CMOS devices on Thick-Film SOI substrates, wherein the CMOS wells, underneath light-sensing device layers, reach the buried oxide of said SOI substrate, and deep trench isolation (DTI), reaching the buried oxide, provides complete lateral dielectric isolation for light-sensing devices and CMOS devices.
Figure 8B:
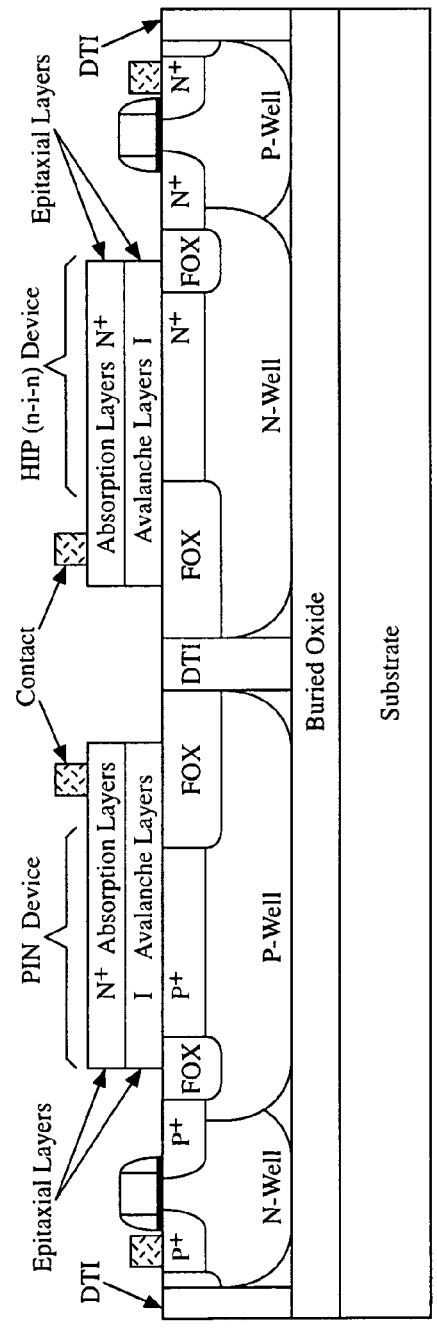

This solution is shown in FIGS. 8A and 8B.

3. SiGeC Layer Profiles for Multi-Spectral Light-Sensing

Figure 9:
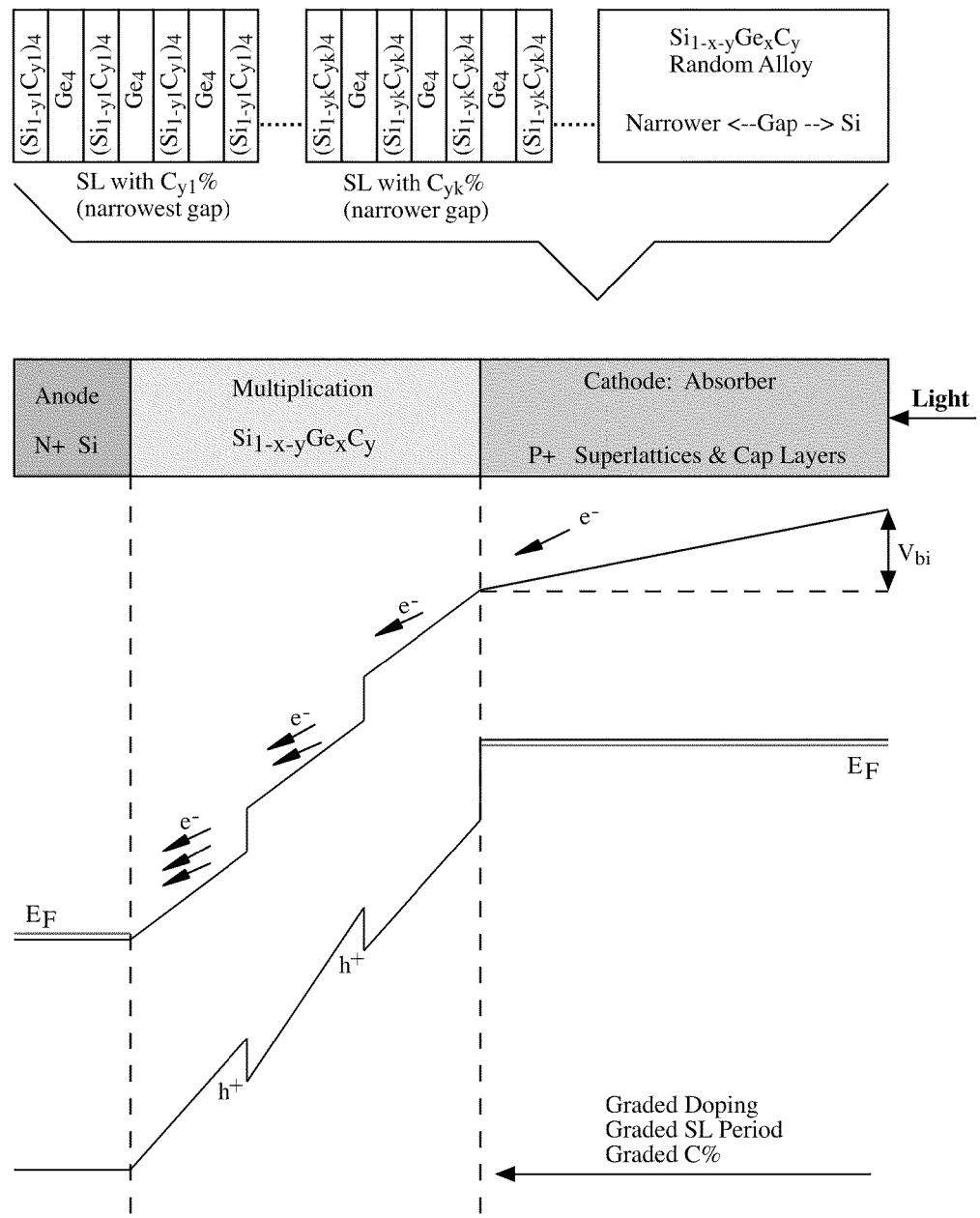
FIG. 9—Preferred embodiment for PIN and HIP light-sensing devices, wherein the light-absorbing layers are separated from the avalanche multiplication layers, and wherein each set of layers is bandgap and doping engineered.

Co-pending patent application Ser. No. 11/070,721, incorporated a number embodiments for the PIN and HIP avalanche photo-diodes. A preferred embodiment is shown in FIG. 9, in which there is a separation between regions for the light-absorption and avalanche amplification, wherein the light-sensing region consists of a degenerately doped region with a graded bandgap.

The degenerate doping prevents depletion even when said region is under very intense illumination, and/or a larger reverse bias is applied.

The monotonic grading of the bandgap of the light-absorption region is achieved by stacking layers with (monotonically) varying bandgaps, wherein some regions are composed of materials with bulk-like properties, while other regions are composed of superlattice materials, which may have direct and indirect bandgaps. Therefore, the absorption region can comprise several superlattice regions, with different monolayer compositions and periods. In the following, more details are given for exemplary embodiments, about the band alignments and light-absorption mechanisms possible to engineer.

3A. Layers for Band-to-Band Light Absorption

The ideal profiles for a light absorption, depend on the substrate material, crystalline orientation of substrate and epitaxial layers, the active material itself (a pure element, random alloys or superlattices), strain in the epitaxial layers, and direction of illumination (light entering the epitaxial stack either through the last or the first epitaxially grown layers). All these factors must be considered and combined to create a light-sensing layer, which for the desired range of wavelengths, has the highest possible coefficient of absorption, and thus absorbs the largest number of photons in the smallest volume of material.

Figure 10:
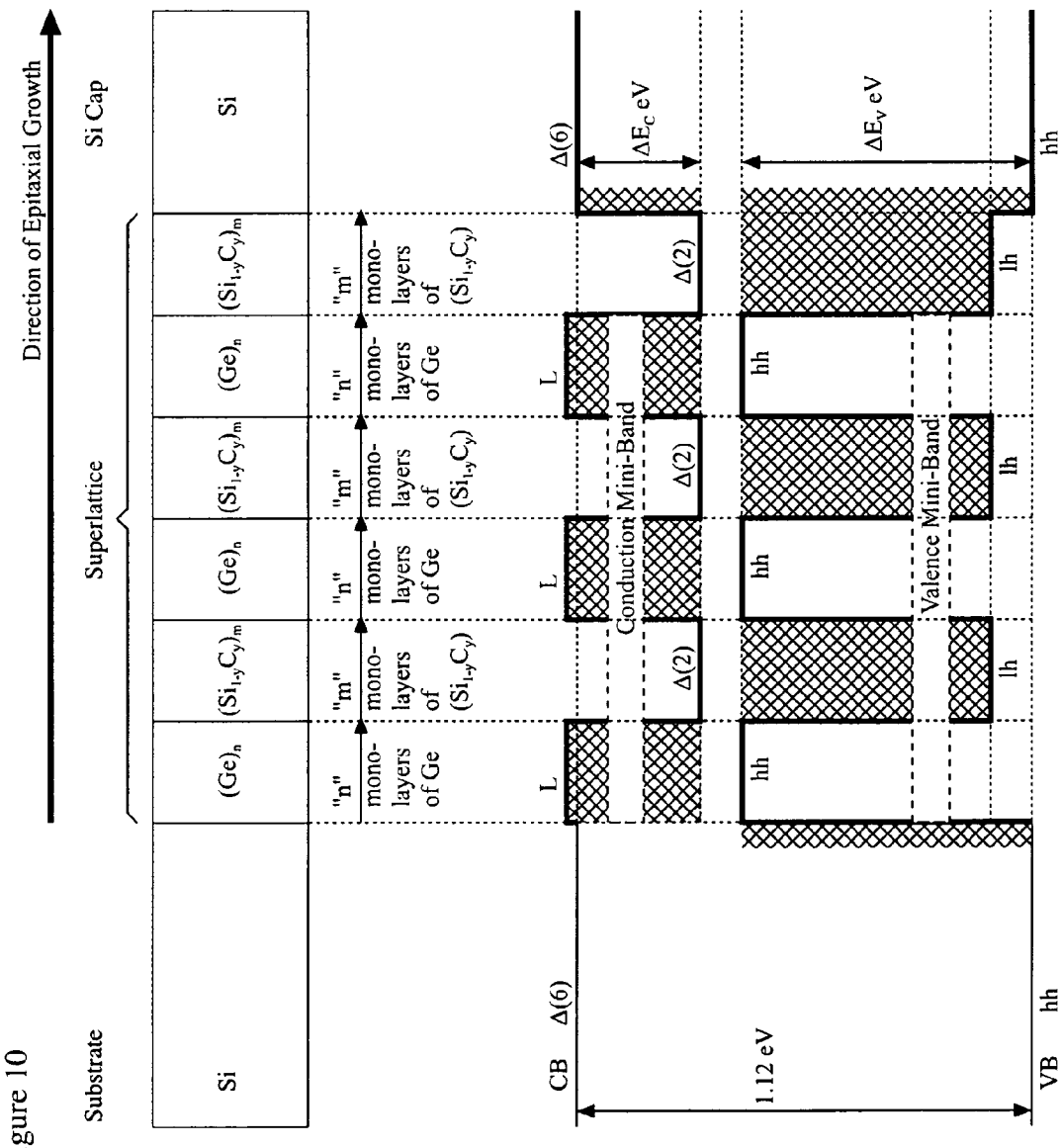
FIG. 10—A qualitative type-II band diagram for $(Si_{1-y}C_y)_m$—$(Ge)_n$ superlattices, to be incorporated in the absorption region of light-sensing devices.

From previous studies of $Si_m$—$Ge_n$ superlattices [Turton and Jaros, Materials Science Engineering, B7 (1990), pp. 37-42], it is apparent that there are a few key parameters that can have a major impact in enhancing the oscillator strength, which in turn determines the coefficient of absorption of a material. However, said theoretical studies did not consider the effects of replacing $Si_m$—$Ge_n$ superlattices with other superlattices such as $(Si_{1-y}C_y)_m$—$(Ge)_n$, or $(Si)_m$—$(Ge_{1-z}C_z)_n$, or $(Si_{1-y}C_y)_m$—$(Ge_{1-z}C_z)_n$. The effects, which were incorporated in co-pending patent application Ser. No. 11/070,721, enable direct bandgap layers grown on (100) silicon substrates (something impossible with just Si and Ge elements), rather than requiring the superlattices to be grown on relaxed SiGe random alloy buffer layers, also known as virtual substrates. A qualitative band diagram for $(Si_{1-y}C_y)_m$—$(Ge)_n$ is shown in FIG. 10.

It should be noted that all variations considered in the aforementioned study for $Si_m$—$Ge_n$ superlattices, lead to type-II heterojunctions, which means that the optoelectronic transitions (light absorption or emission) necessarily take place at each heterojunction interface, where the spatial overlap of the wavefunctions is maximum. Naturally this is already assuming that the superlattice parameter design leads to vertical overlap of the K-vectors in the valence and in the conduction minibands. Because of this type-II alignment, it is beneficial to have maximum spread in K-vectors at the interface.

One major factor for an oscillator strength comparable to that of a direct bandgap bulk semiconductor such as GaAs, is to have a type-I superlattice. In the following, it is described how this can be achieved with pseudomorphic epitaxial layers comprising Si, Ge, and C, elements, that is, with layers that are compatible with silicon substrates, and also with the restrictions of CMOS processing. The pseudomorphic growth of $(Si_{1-y}C_y)$ alloys on (100) silicon, results in the lowering of the conduction band edge and also of the valence band edge (with respect to pure silicon) along the direction of epitaxial growth. The magnitude of the lowering of the conduction band is linearly proportional to the amount of carbon, at least for the usual ranges of carbon content, which are the ones possible to grow with high crystalline quality. Roughly, the conduction band is lowered by 46 meV for each percentage point of carbon, and at the same time the valence band (light holes) moves up by roughly 19 meV for each percentage point of carbon. High quality films with carbon content up to 2% have been demonstrated, wherein the charge carrier lifetime is similar to that of pure silicon [Ramakrishna Shivaram et al., Solid-State Electronics 44 (2000) 559-563].

Therefore, type-I superlattices can be fabricated by growing $Si_m$—$(Si_{1-y}C_y)_n$ pseudomorphic films directly on (001) Si substrates. However this configuration is strain-asymmetric, which limits the maximum amount of carbon content in the $(Si_{1-y}C_y)$ films and/or the maximum value for "n", and/or the maximum thickness for the superlattice. These limitations can be overcome by including Ge or Sn impurities in the superlattice, as it is described in the following.

Figure 11:
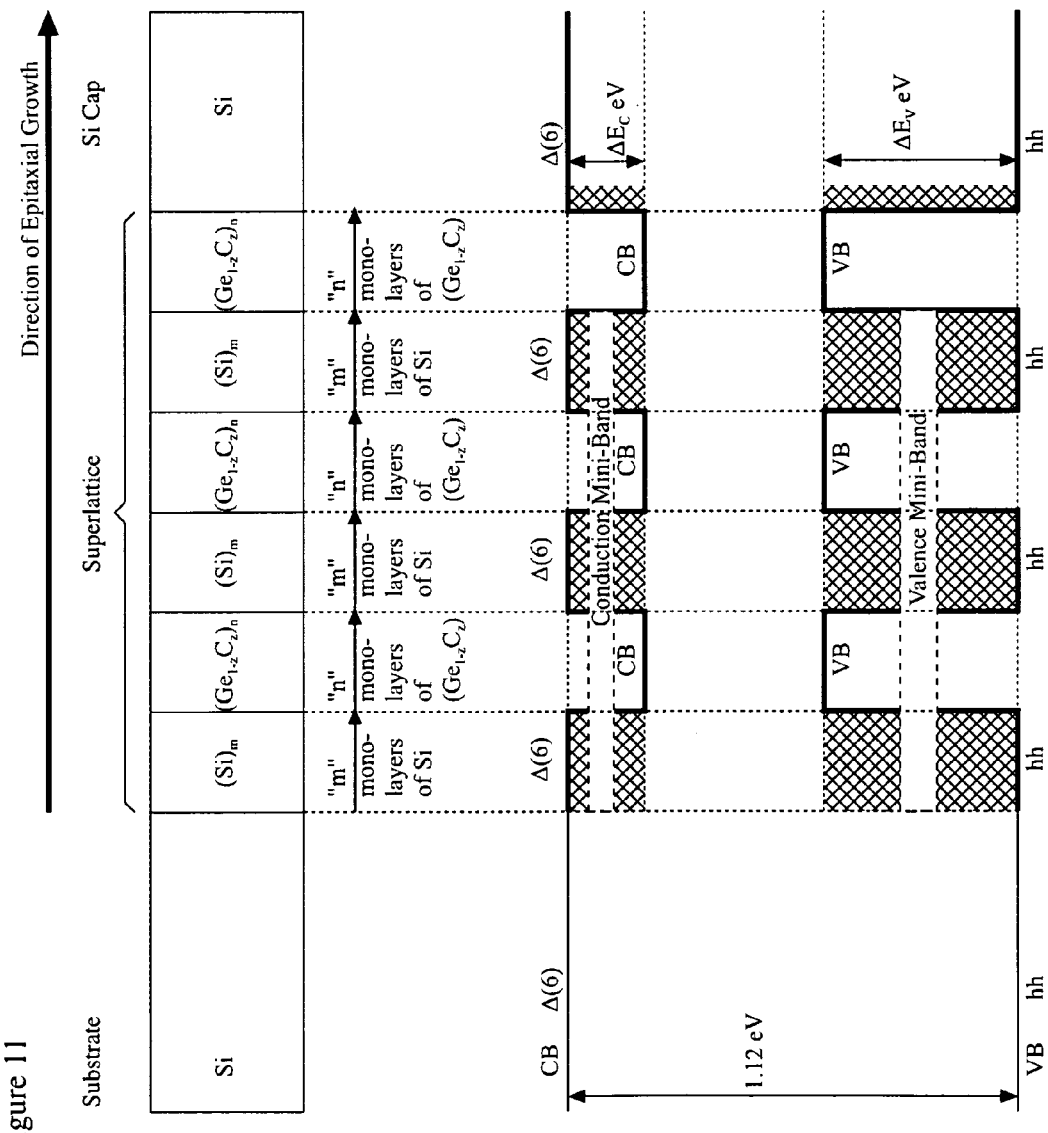
FIG. 11—Presumed qualitative type-I band diagram for $Si_m$—$(Ge_{1-z}C_z)_n$ superlattices, to be incorporated in the absorption region of light-sensing devices.
Figure 12:
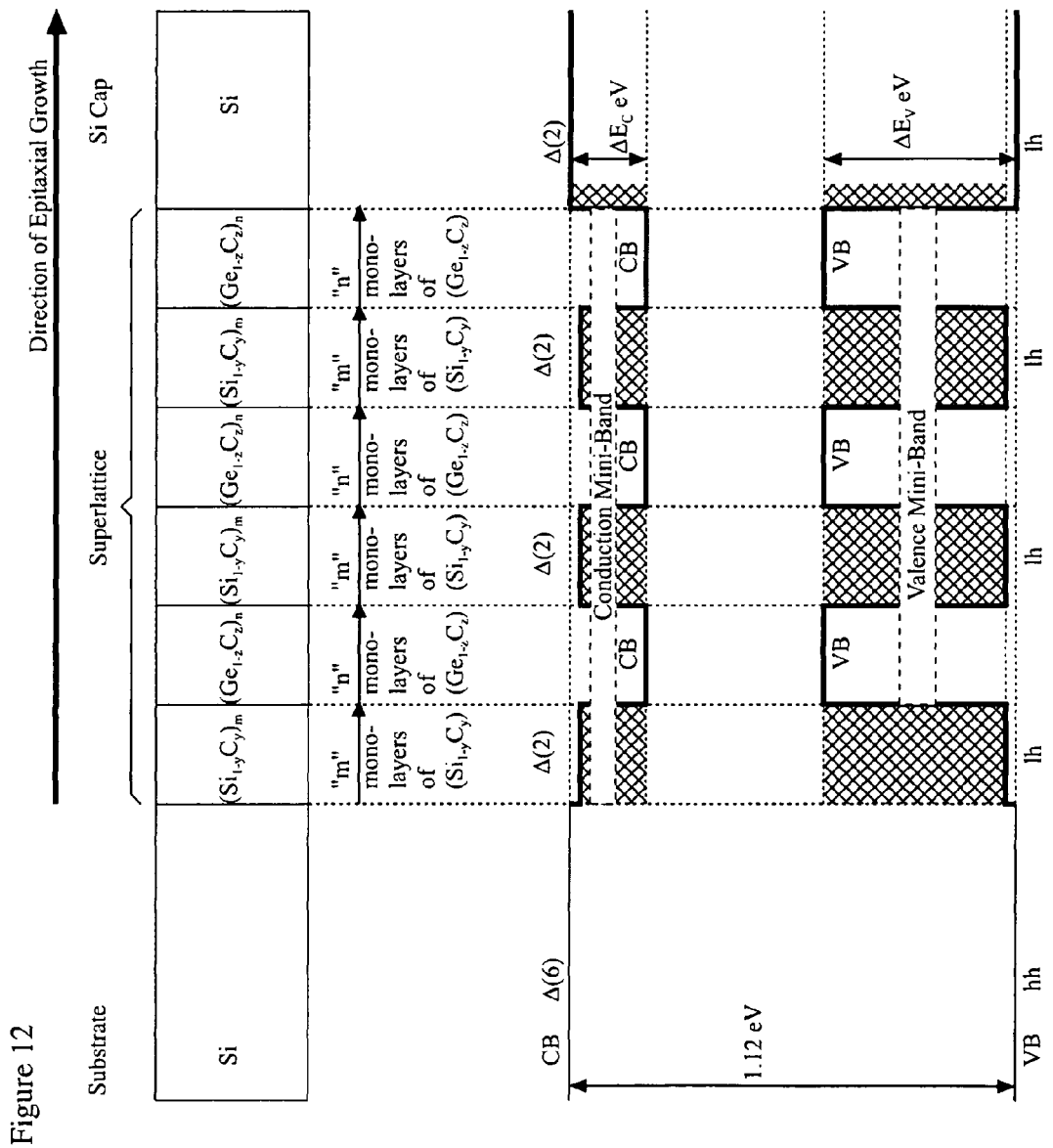
FIG. 12—Presumed qualitative type-I band diagram for $(Si_{1-y}C_y)_m$—$(Ge_{1-z}C_z)_n$ superlattices, to be incorporated in the absorption region of light-sensing devices.

In light of the foregoing, a type-I superlattice is likely to be accomplished with superlattice compositions such as $Si_m$—$(Ge_{1-z}C_z)_n$ or $(Si_{1-y}C_y)_m$—$(Ge_{1-z}C_z)_n$, as schematically depicted in FIG. 11 and FIG. 12, respectively. Both superlattices, with for example m=n=5 or m=n=12, should have direct bandgaps and large oscillator strengths, given that both electrons and holes would be confined in the $(Ge_{1-z}C_z)$ layers. Very high crystalline quality epitaxial $(Ge_{1-z}C_z)$ films, strained to (100) Si have been demonstrated [M. Todd et al., Appl. Phys. Lett. Vol. 68, No. 17, pp. 2407, 22 Apr. 1996], but the electronic and opto-electronic properties are still not well documented.

The presence of carbon in the Ge-rich layer is likely to lower the conduction band of the Ge-rich layer below that of a pure silicon layer, even if at a cost of having a smaller offset in the valence band. Since the valence band offset of Ge strained to Si is very large, even for relaxed Ge layers on silicon, there is no danger of it vanishing because of too much carbon in the GeC film. Therefore, it seems certain that there is a certain concentration of carbon in $(Ge_{1-z}C_z)$ films, strained to Si, at which the conduction band edge is lowered with respect to pure silicon. With the appropriate superlattice period, such as m=n=5, a type-I alignment with direct bandgap and very large oscillator strength is likely to be created.

It is then reasonable to assume that there will be a carbon percentage for which the $(Ge_{1-z}C_z)$ random alloy pseudomorphically grown on (100) silicon substrates, will have a conduction band edge lower than that of silicon. It should be kept in mind that Ge on silicon has a large valence band offset, even in the absence of strain. It is known that 11% carbon concentration in Si layers, completely compensates pure Ge on silicon. Then, it can be assumed that a $(Ge_{1-z}C_z)$ random alloy with more than 11% of carbon will result in a conduction band edge that is lower than that of silicon. Based on a simple extrapolation of the separate effects of these elements, for a range of carbon concentration (lower limit 11%) this alloy should have a type-II band alignment with (100) silicon. It is also possible that the band structure of a $(Ge_{1-z}C_z)$ random alloy is significantly different from a linear extrapolation of the properties of $(Si_{1-y}C_y)$ random alloys and Ge layers strained to Si, in the same manner that the band structure of $(Si_{1-y}C_y)$ random alloys are from the linear interpolation between Si and SiC (silicon carbide). In that case, the range of Ge and C compositions in the $(Ge_{1-z}C_z)$ random alloy could be different from those outlined earlier, but it is nonetheless almost certain that there will be a range for said concentrations that produces the desired band structure effects.

3B. Layer Stack for a Broadband Light-Absorption Through Band-to-Band Transitions A broadband photo-diode with a wavelength range much larger that an silicon or germanium substrate, can be constructed by stacking superlattices with multiple minibandgaps, and stacking layers with random alloys and/or pure elements, resulting in a monotonically varying bandgap. White light coupled through the surface the layers with the widest bandgap, is progressively stripped of the shorter wavelengths, which are absorbed as the white light beam progresses further into the layer stack.

In-situ doping can be engineered, in conjunction with the variation in bandgap, to produce a continuous and monotonic built-in drift electric field across the entire absorption region of the photo-diode, driving photo-generated carriers towards a charge collecting region. Such built-in field is crucial for carriers photo-generated near the surface from which light is coupled, to be driven away from said surface and thus avoid fast annihilation due to the typically high density of surface recombination centers. This is particularly relevant to increase the QE for the shorter wavelengths, such as Blue and UV.

Figure 13:
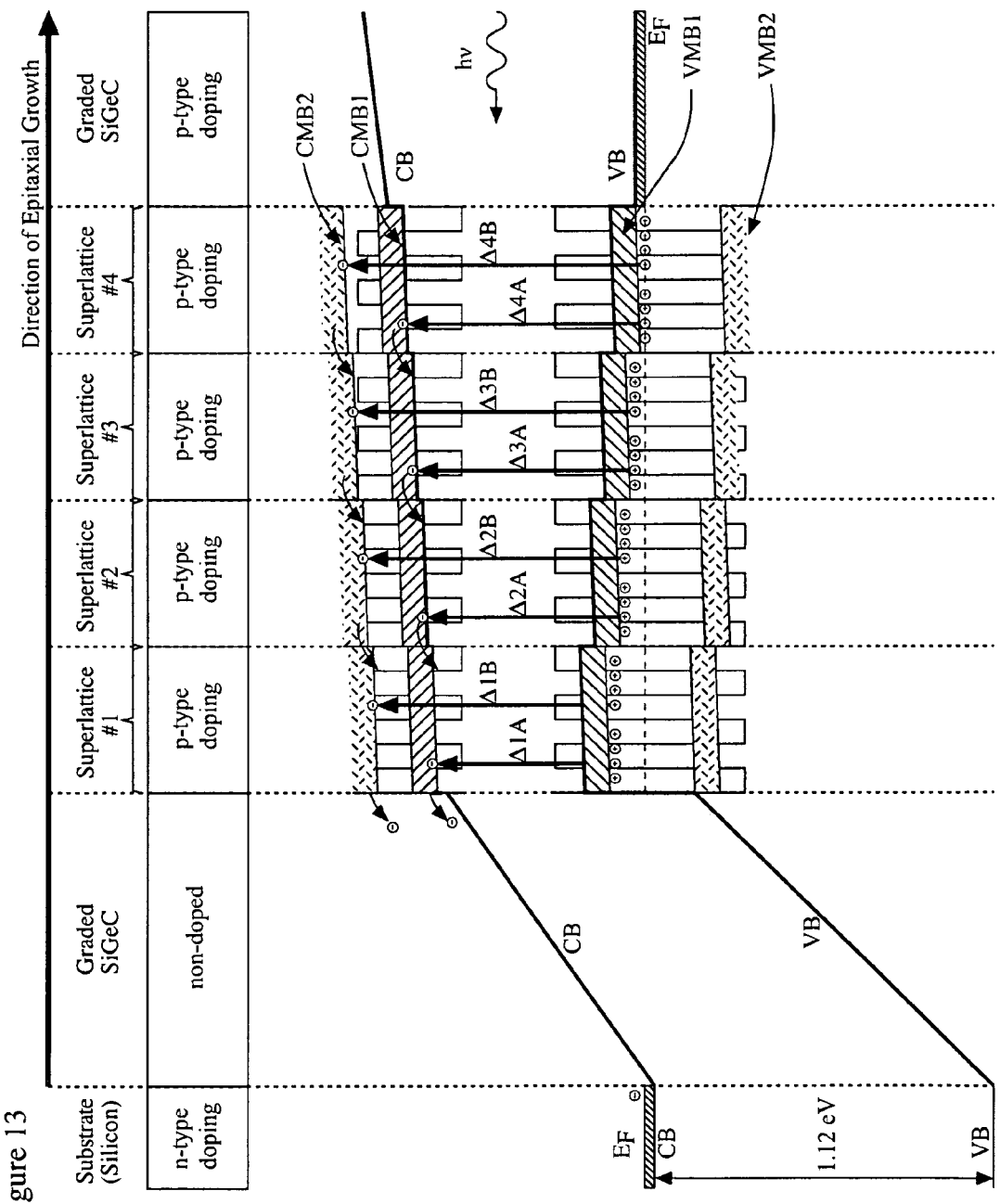
FIG. 13—Qualitative band diagram for light-sensing devices, wherein the superlattice light-absorption layer is p-type doped, and epitaxially grown on a n-type substrate, and wherein light-sensing occurs through miniband-to-miniband transitions.

The aforementioned stacking of superlattices with multiple compositions and periods, ordered in decreasing or increasing magnitude of the minibandgap, is the superlattice equivalent of a SiGe (and/or SiGeC) random alloy with graded Ge (and/or C) concentration, producing in a triangular potential profile. In order to insure the possibility of drift-diffusion transport perpendicularly to the stack of superlattices, care must be taken in order to avoid a "broken minigap", in any of its configurations, as shown in FIG. 13. The combination of different superlattice composition and period is likely to enable the design of a stack of superlattices with an energy band structure consisting of a sequence of small difference in minibandgap magnitude between adjacent superlattices blocks in the stack. This configuration results in multiple ranges of photo-absorption across the stack, and allows charge drift-diffusion transport across the superlattice stack, thereby allowing the entire stack to act as a single photo-absorber with a continuous coefficient of absorption with a wavelength cutoff determined by the smallest minibandgap in the stack.

It should kept in mind that the possibility of transport perpendicularly to the plane of the superlattice layers (coupled MQWs), leads to selections rules that are far less restrictive than the selection rules for decoupled MQWs, wherein it is not possible to have drift-diffusion transport perpendicularly to the plane of said MQWs.

In the configuration shown in FIG. 13, the superlattice absorption layer p-type doped, with an electrostatic built-in field that forces photo-generated electrons towards the substrate region. It is also shown that the band alignment between the superlattice with the narrowest gap, is grown on an epitaxial layer with a graded composition and bandgap such that the conduction band edge of said graded layer does not present a potential barrier for electrons.

Figure 14:
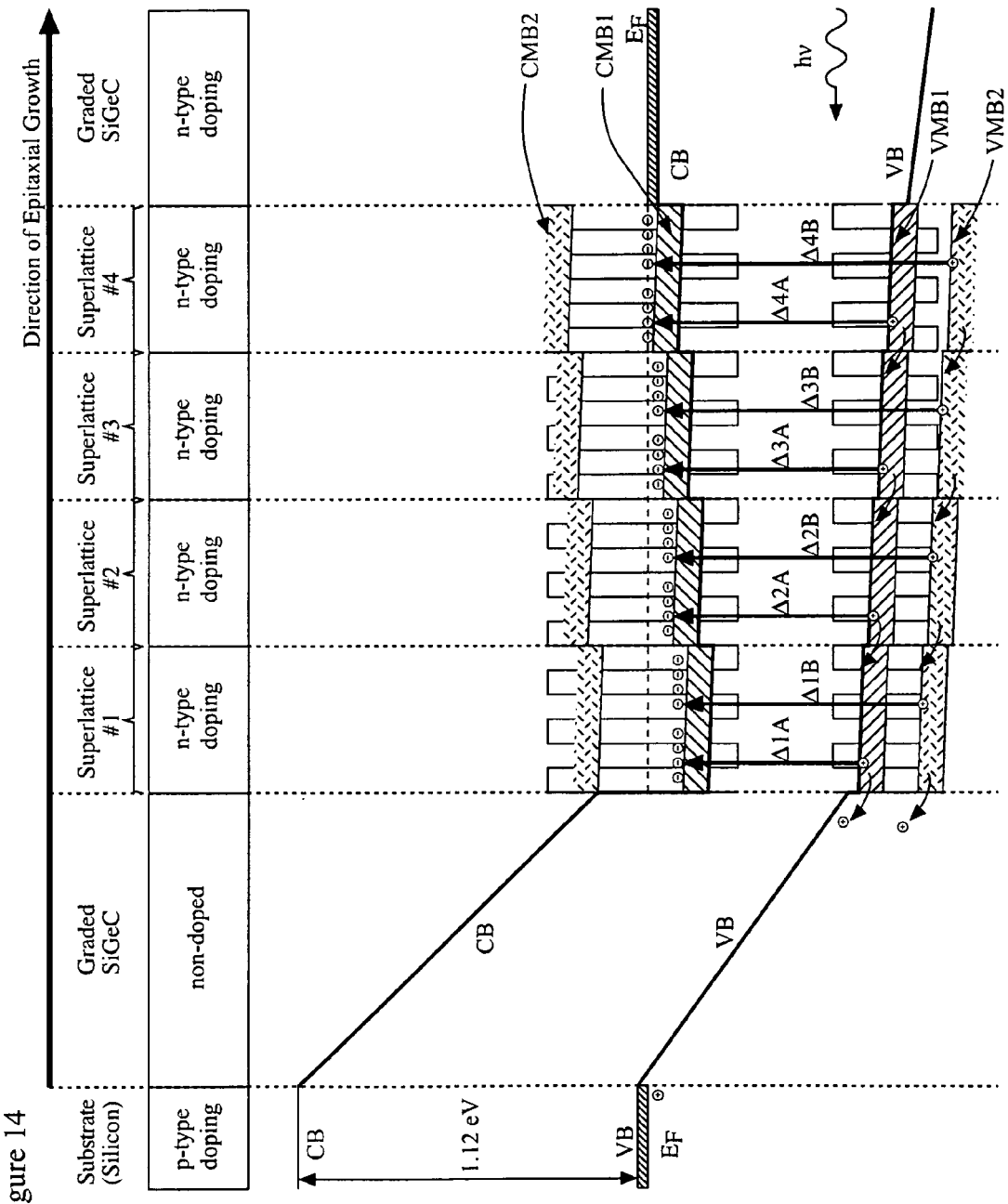
FIG. 14—Qualitative band diagram for light-sensing devices, wherein the superlattice light-absorption layer is n-type doped, and epitaxially grown on a p-type substrate, and wherein light-sensing occurs through miniband-to-miniband transitions.

An alternative configuration, with for reverse doping types and bandgap gradients for the complementary bands, in which a similar effect is achieved for photo-generated holes, as shown in FIG. 14.

3C. Layers for Light Absorption within the Same Band

In co-pending patent application Ser. No. 11/070,721, the layers for the sensing of MWIR and/or LWIR wavelengths were described as forming a Heterojunction Internal Photoemission (HIP) device, consisting of a heterojunction between a highly doped region, wherein light-sensing takes place through free charge carrier absorption, and a lowly doped barrier region wherein charge carriers are collected. The wavelength range and dark-current of HIP devices are determined by the effective barrier height of the heterojunction: the lower the barrier the longer the wavelength possible to detect, and the higher the dark-current. The quantum efficiency (QE) of HIP devices is fairly low (typically <1%), partly because the principle of operation with such device architecture, leads to the layer wherein absorption takes place to be very thin. The useful thickness of this layer is limited by the Debye length, which typically is of the order of 1 nm, for SiGe regions with doping concentrations around ~1E20 $cm^{-3}$.

A possible solution to improve QE would be to incorporate a stack of multiple "HIP wells", wherein each "HIP-well" might contribute with <1% in QE. However, in "multiple HIP wells" excited carriers, while traveling towards the collection electrode, can be captured in a "HIP well", thus decreasing the external quantum efficiency. The "HIP-Wells" just mentioned are different from quantum wells (QWs) and/or multiple quantum wells (MQWs). In HIP-wells the energy is not quantized, and they are capable of absorbing a much larger range of wavelengths than QWs and MQWs, because for the latter, only one wavelength is absorbed in each QW, due to energy/wavelength quantization.

The present invention discloses a new solution for sensing wavelengths in the infrared ranges of MWIR, LWIR, VLWIR, with high quantum efficiency and over a wide range of wavelengths.

Figure 15:
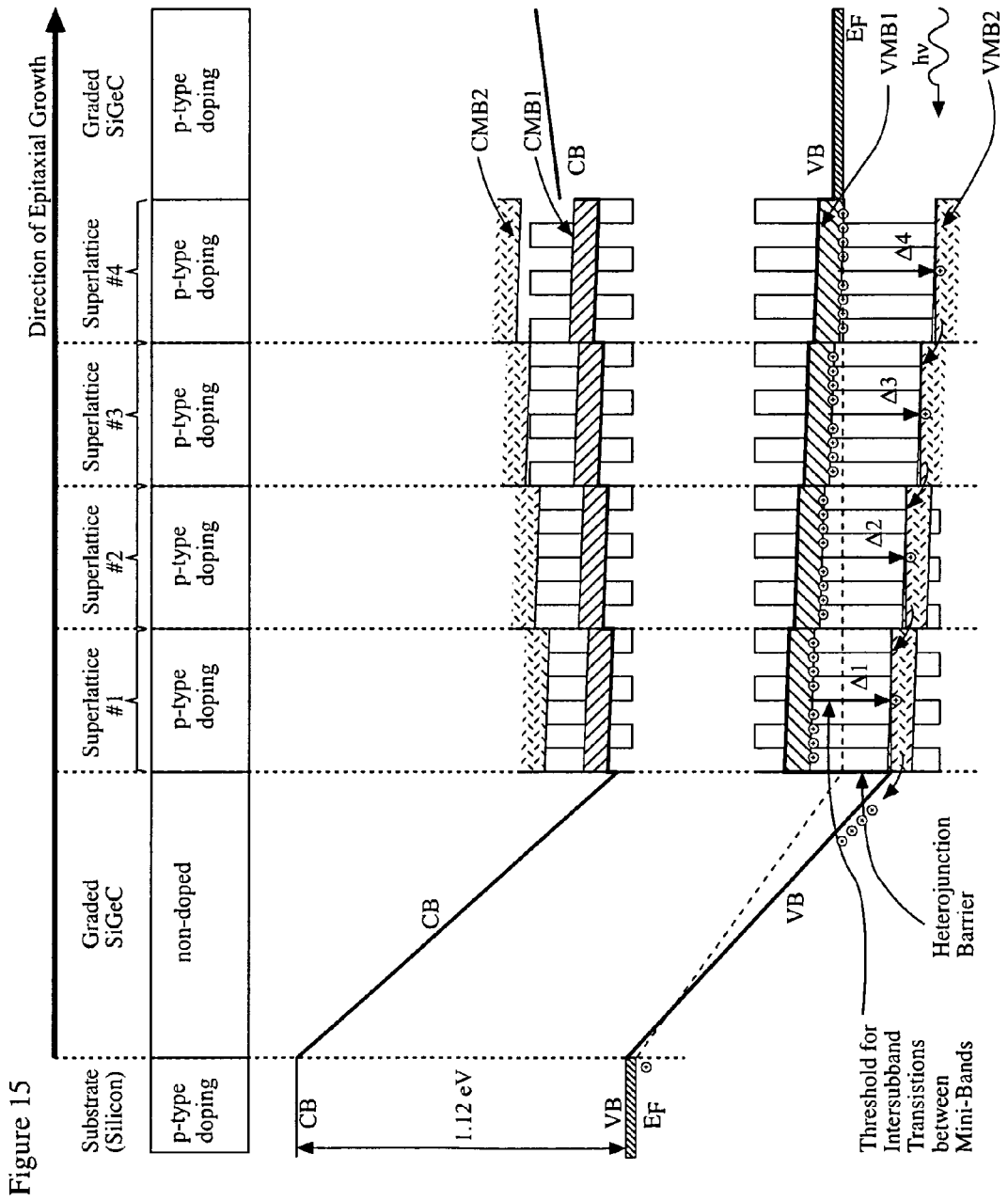
FIG. 15—Qualitative band diagram for light-sensing devices, wherein the superlattice light-absorption layer is p-type doped, and epitaxially grown on a p-type substrate, and wherein light-sensing occurs through intersubband transitions in the valence miniband of the superlattice.
Figure 16:
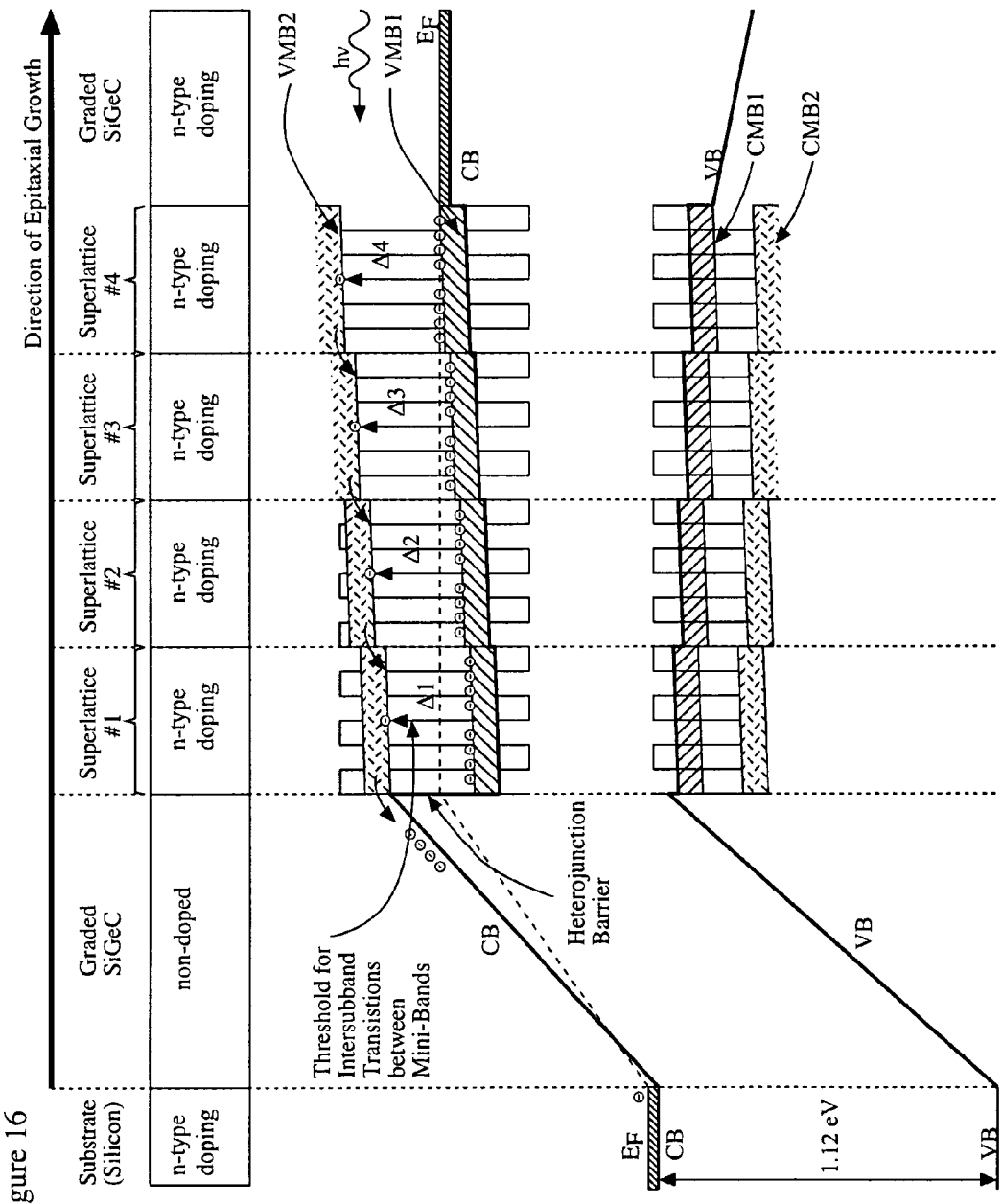
FIG. 16—Qualitative band diagram for light-sensing devices, wherein the superlattice light-absorption layer is n-type doped, and epitaxially grown on a n-type substrate, and wherein light-sensing occurs through intersubband transitions in the conduction miniband of the superlattice FIG. 17—Qualitative band diagram similar to that of FIG. 13, but with an avalanche multiplication region that is bandgap and doping engineered with deep level impurities.

The new device physics mechanism is shown in FIG. 15, in which the sensing of IR radiation takes place through intersubband transitions between mini-bands of a superlattice, which can be easily contrasted with the mechanism depicted in FIGS. 17, 18, 19 and 20 of co-pending patent application Ser. No. 11/070,721. In the current disclosure, the band diagram shown in FIG. 15 is for hole intersubband transitions between mini-bands, while FIG. 16 shows the corresponding implementation for electron intersubband transitions between mini-bands.

Superlattices are formed by MQWs in which the individual QWs are coupled, thereby combining the subbands of the individual QWs into minibands of delocalized electronic energy levels perpendicular to the QWs, and that extend themselves throughout the superlattice layers, by the overlapping of tunneling states (in the barrier layers) and eigenstates in the wells (in-between barriers).

Carriers residing in the lowest miniband are blocked to travel to the region of charge collection by a heterojunction interface with a barrier material possessing the appropriate barrier height and barrier width (layer thickness). The barrier height is below the bottom of the first excited miniband, thereby allowing excited carriers to travel towards the region of charge collections.

In FIG. 15 the photo-absorption takes place through hole intersubband transitions, and said barrier is formed at the interface between the layers identified as the non-doped SiGeC graded layer and Superlattice #1. The grading of said SiGeC layer is such that its valence band edge matches the lowest energy level of the first excited sub-mini-band (VMB2) of Superlattice #1, thereby allowing any hole residing in VMB2 to cross over said interface, and simultaneously blocking any holes residing on the ground level sub-miniband (VMB1) from crossing into said SiGeC layer.

In FIG. 16 the photo-absorption takes place through electron intersubband transitions, and said barrier is formed at the interface between the layers identified as the non-doped SiGeC graded layer and Superlattice #1. The grading of said SiGeC layer is such that its conduction band edge matches the lowest energy level of the first excited sub-mini-band (CMB2) of Superlattice #1, thereby allowing any electron residing in CMB2 to cross over said interface, and simultaneously blocking any electrons residing on the ground level sub-mini-band (CMB1) from crossing into said SiGeC layer.

The range of wavelengths possible to absorb, is determined by the difference in energy levels between VMB1 and VMB2, or between CMB1 and CMB2. The barrier between the graded SiGeC layer and superlattice #1, does not play any role in photo-absorption, except perhaps for a region of no more than 1 or 2 nanometers into superlattice #1. This is in sharp contrast with the HIP devices of prior art. Because of the energy levels between VMB1 and VMB2, or between CMB1 and CMB2, are forbidden, the alignment of the band edge (valence or conduction respectively) of the graded SiGeC can be adjusted within that range of forbidden energies (gap between mini-bands), without significant impact on the photo-absorption process and/or blocking dark-current.

There are combinations of barrier height and well width that result in only one miniband, either in the conduction band, or valence band, or in both bands. In such configuration, photo-absorbed carriers are excited into the continuum of eigen-states lying above the potential barriers. In this configuration, intersubband transitions will take place between a mini-band and said continuum of eigen-states, leading to an absorption spectrum without a short-wavelength cutoff. Energy band diagrams for this configuration are very similar to those shown in FIGS. 15 and 16, with the only significant difference being the absence of a maximum energy limit for the excited minibands CMB2 and VMB2.

For HIP (and multiple HIP-wells) and QWIP types of devices, the separation between wells (the barrier layers) do not contribute for photo-absorption, and therefore for the same total film thickness, the useful absorption length is much smaller, probably less than 50%, of the useful thickness of the superlattice.

For the particular case of $(Si_{1-y}C_y)_m$—$(Ge)_n$, superlattices, there is also mixing of different subbands: in the conduction band that is due to the splitting of the valleys, with a lowering 2-fold $\Delta_\infty$ valleys, relative to the 4-fold $\Delta_\|$ valleys; while in the valence band that is due to the mixing of eigenstates from light hole and heavy hole subbands.

The minibands, being a mixture of different subbands, enable absorption of radiation perpendicular to the substrate (perpendicular to the epitaxial layers), while selection rules forbid such from happening between different eigenvalues of the same band. Also, minibands allow transport of charge carriers perpendicularly to the heterojunction barriers, and thus moment does not have to be zero in the direction perpendicular to the epitaxial layers, which is not possible in decoupled MQWs. This leads to different selection rules than those applicable to MQWs.

The possibility of electron intersubband transitions in the LWIR & MWIR ranges (50 meV to 300 meV) was first reported by R. J. Turton and M. Jaros "Intersubband optical transitions in Si—$Si_{0.5}Ge_{0.5}$ superlattices", Appl. Phys. Lett. 54, 1986 (1989).

This study of intersubband transitions in the conduction band was done for Si—Ge superlattices without Carbon, but the incorporation of carbon provides an extra degree of freedom to engineer the minibands and thus widened the range of wavelengths possible to absorb. With the suitable choice of superlattice period and composition, such as carbon content, it is possible to fine-tune the wavelength range of absorption through intersubband transitions in the conduction band and/or in the valence band. Due to the energy range and delocalized nature of the minibands, it is possible to have absorption of MWIR and LWIR radiation over the entire thickness of the superlattice region, and thus have an optical path that can be hundreds of nanometers, thereby resulting in an extraordinary improvement of QE over HIP (and multiple HIP-wells) and QWIP types of devices.

Therefore, an increase in QE automatically translates into a linear increase in Detectivity (D*), through the relation:

$$D^* = \frac{QE}{h\nu}\sqrt{\frac{q}{2j_d}}$$

wherein QE is the external quantum efficiency, $j_d$ is the dark-current, hv is the photon energy, and q is the electron charge.

The intersubband dark-current of a superlattice device is expected to be similar to that of HIP and QWIP devices, which is mainly determined by the desired wavelength cutoff.

While for HIP and QWIP devices the wavelength cutoff is determined by the barrier height for thermionic emission and the QW barrier height (approximately). For intersubband transitions in superlattices there are several factors determining the dark-current, which are more complex that those for bulk-like materials. For example, in bulk-like materials the typical dispersion relations (energy as a function of K-vector) for the conduction and valence bands are continuous, while for superlattices said dispersion relations are not continuous, and the calculation of the density of sates is derived from a formula that is significantly more complex than that for a bulk-like material. Also both the electron and hole effective masses are significantly changed from the elemental components of the superlattice, due to strain and quantization effects. These factors are relevant for band-to-band transitions as well as for intersubband transitions. Actually for the intersubband transitions there is also a barrier height that is similar to that in HIP and QWIP devices, but which for the current invention has some particular restrictions.

It is also worth noting that, with HIP devices, such as those described in co-pending patent application Ser. No. 11/070,721, light must be coupled from the side of the semiconductor region that has lower doping and that provides the band edge barrier, because if light was coupled from the side of thick highly doped absorption region, light would be absorbed but charge would not be collected, as photo-absorption would take place far away from the heterojunction across which thermionic emission is to take place, and the photo-excited carriers would scatter without crossing said heterojunction.

For the devices of the present invention, shown in FIGS. 15, and 16, light can also be coupled from the side of the highly doped superlattice layer stack. The reason is that the ground level minibands, VMB1 in FIG. 15, and CMB1 in FIG. 16, are fully occupied through heavy doping (p-type and n-type respectively), which forces any photo-absorption event to promote a charge carrier to the excited miniband, (VMB2 or CMB2, respectively), rather than just gaining energy within the same miniband. Therefore the new devices of the current invention are suitable for sensor with front-side and/or back-side illumination configurations.

4. Bandgap and Doping Engineering of the Avalanche Region

Co-pending patent application Ser. No. 11/070,721 presented in FIGS. 9, 10, 11 and 12, exemplary profiles for bandgap engineering of the avalanche region of the photo-diode's epitaxial layers. One motivation for bandgap engineering of said profiles is to design an unipolar avalanche region, wherein only one type of charge carriers (electrons or holes) is multiplied through impact ionization processes. Another reason is to create regions with a smaller bandgap, strategically located at the points of higher probability for impact ionization events. These regions are desirable because a smaller bandgap requires less energy in order for impact ionization, which in conventional avalanche devices, is dependent on the magnitude of the bandgap.

The current invention introduces an additional parameter for the engineering of the impact ionization regions, which is the doping of the avalanche region with impurities that introduce energetic states in the bandgap of the host semiconductor layer, that are deep enough so that only a fraction of said impurities is ionized at room temperature. For a silicon region, Indium has an acceptor positioned 0.16 eV above the valence band edge, and Tellurium, has a donor level positioned 0.14 eV below the conduction band edge. For germanium regions, there are other doping impurities with similar positioning with respect to the conduction and valence band edges.

The most important advantage of using Indium or Tellurium in silicon is that impact ionization events can be triggered with much lower carrier energies, which means that much lower electric fields are required, which in turn allows the operation of avalanche devices with much lower voltages. The choice of impurity to be used depends on a few factors, such as the semiconductor host lattice into which the impurity is incorporated, and of the temperature at which the device is to be operated. For electron-only avalanche multiplication the impurity should a donor (n-type) while for hole-only avalanche multiplication, the impurity should be an acceptor (p-type).

For impurities with deeper energy levels, it is possible to increase their concentration without increasing the concentration of free charge carriers, and therefore without decreasing the resistivity of the material.

The incorporation of these impurities can be used as an alternative to, or in conjunction with heterojunction bandgap engineering of the avalanche region.

Figure 17:
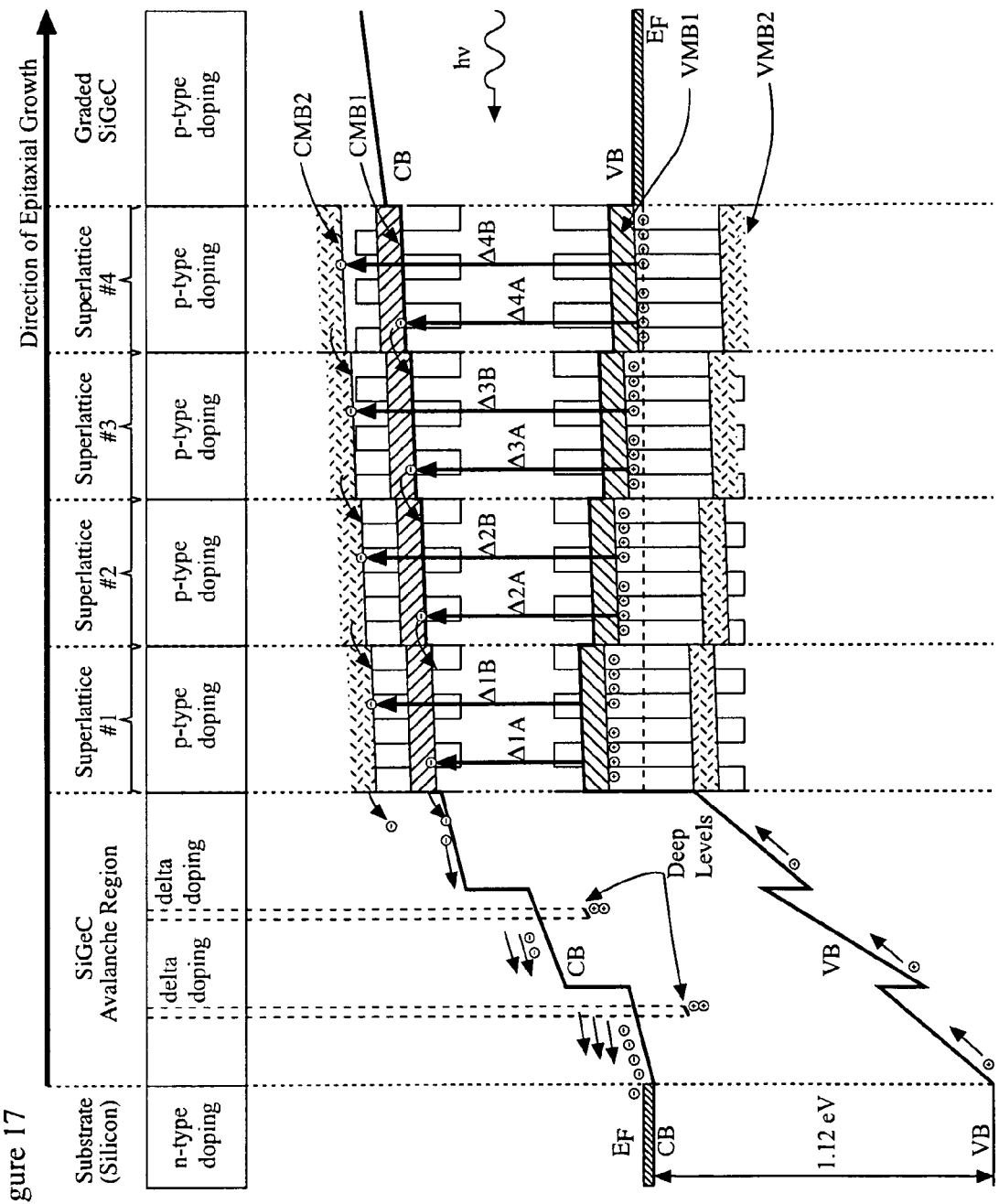
Figure 18:
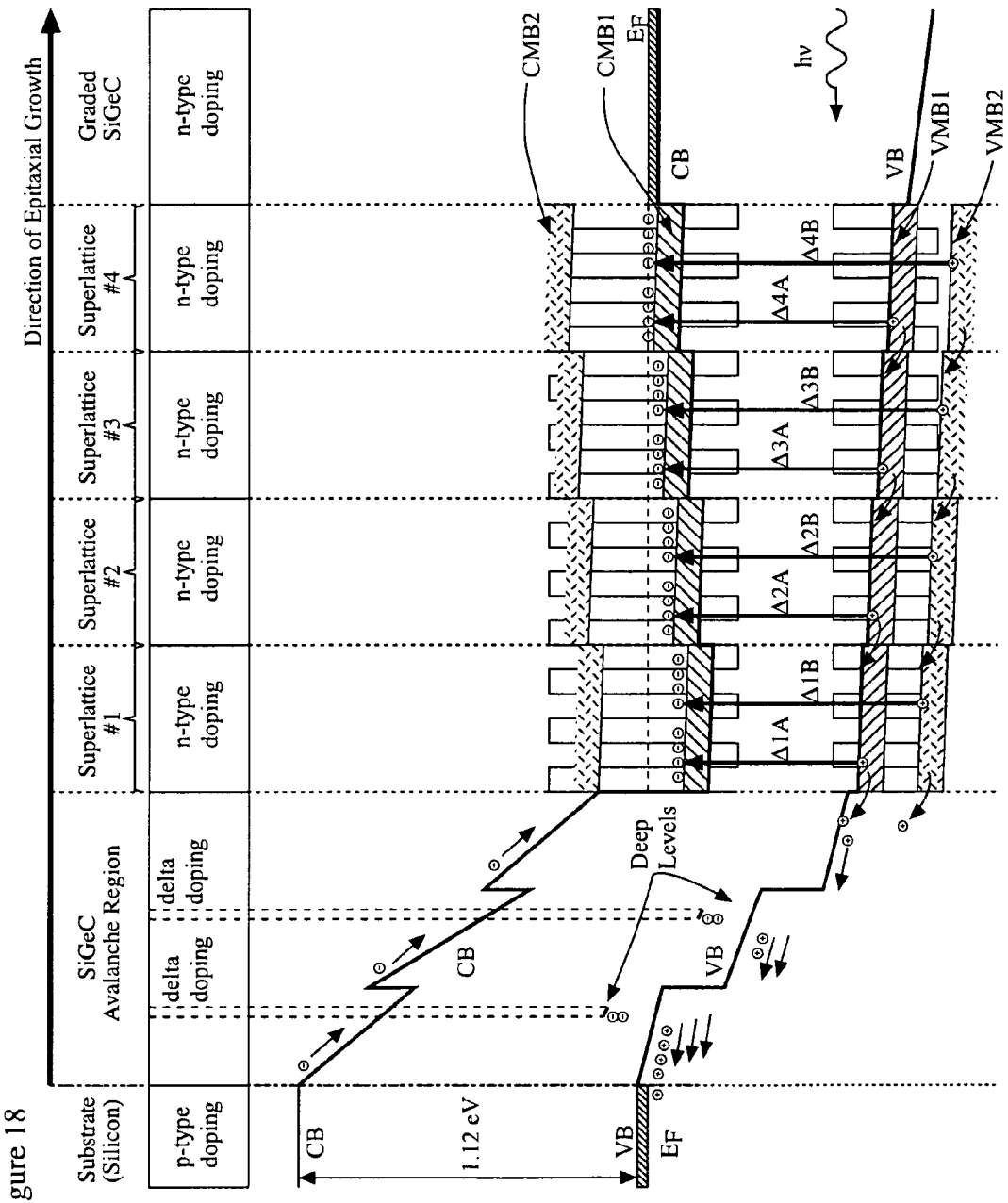
FIG. 18—Qualitative band diagram similar to that of FIG. 14, but with an avalanche multiplication region that is bandgap and doping engineered with deep level impurities.

The layer stacks shown in FIGS. 17 and 18, are modified versions of the devices shown in FIGS. 13 and 14, respectively, wherein the graded SiGeC layer, is replaced by a bandgap and doping engineered avalanche multiplication region.

Figure 19:
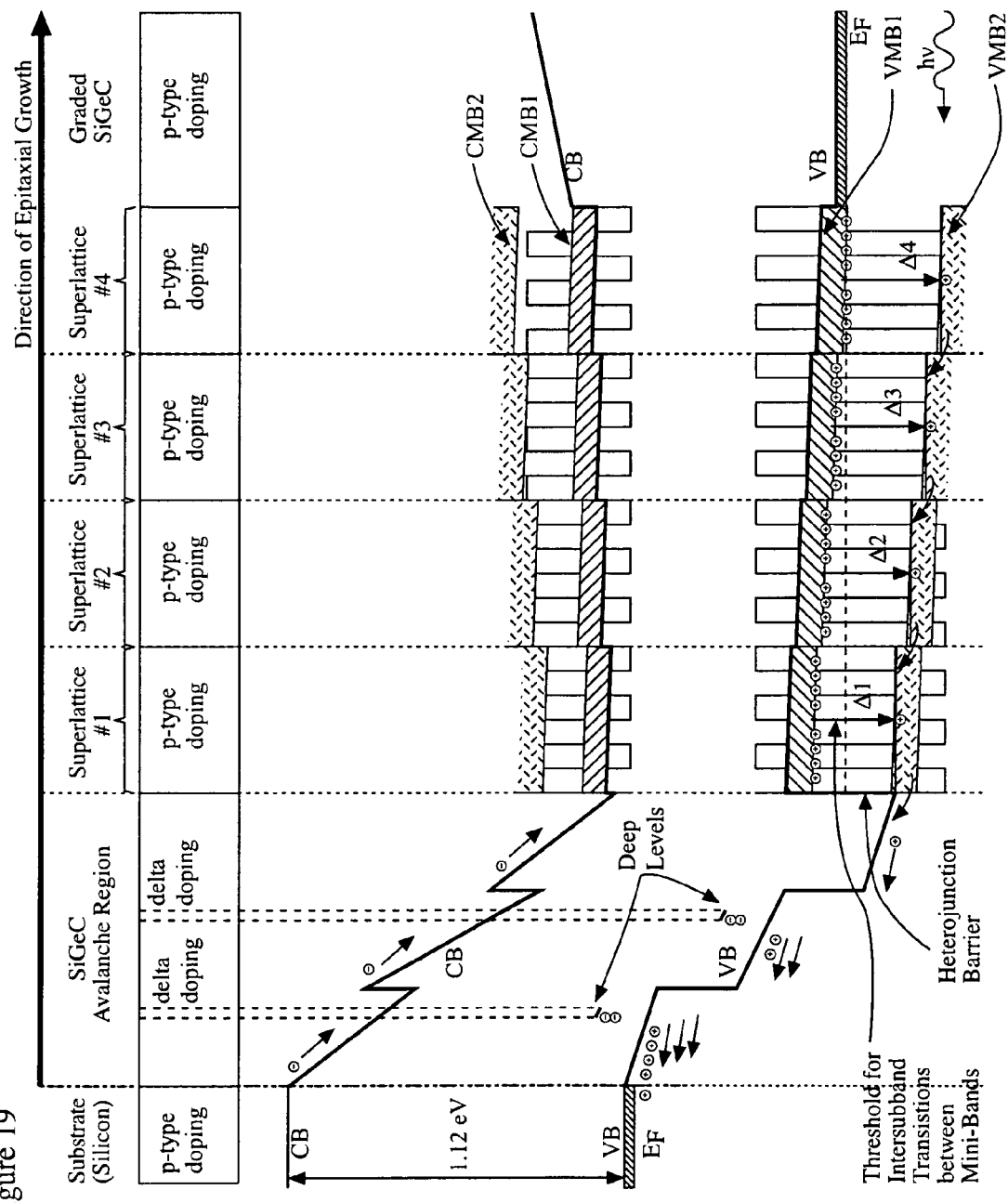
FIG. 19—Qualitative band diagram similar to that of FIG. 15, but with an avalanche multiplication region that is bandgap and doping engineered with deep level impurities.
Figure 20:
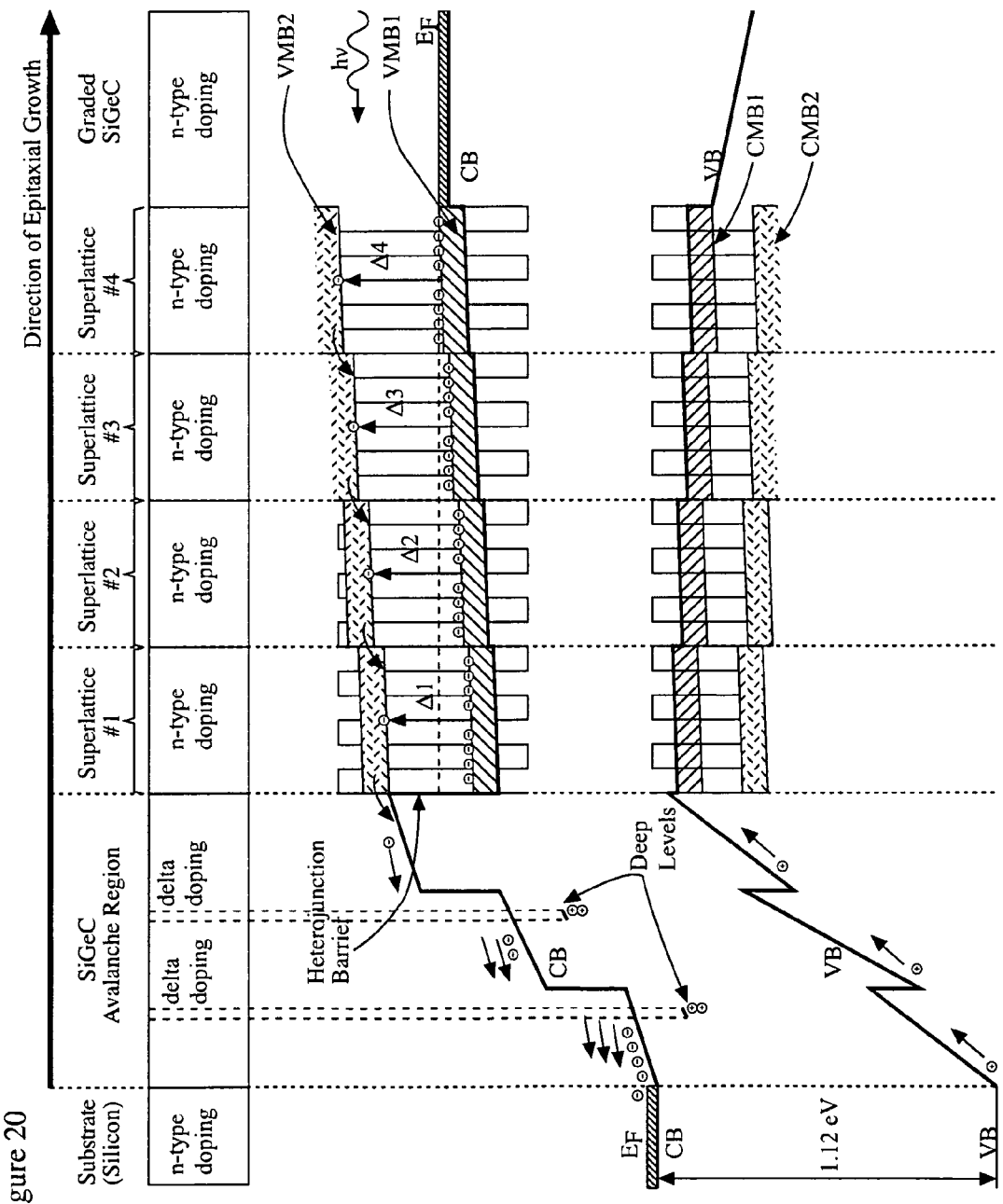
FIG. 20—Qualitative band diagram similar to that of FIG. 16, but with an avalanche multiplication region that is bandgap and doping engineered with deep level impurities.

The layer stacks shown in FIGS. 19 and 20, are modified versions of the devices shown in FIGS. 15 and 16, respectively, wherein the graded SiGeC layer, is replaced by a bandgap and doping engineered avalanche multiplication region.

The exemplary doping impurity for electron-only avalanche is Tellurium, and the exemplary doping impurity for hole-only avalanche is Indium.

5. Patterning of Epitaxial Layers into Vertical Nanowires

The patterning of at least a portion of the thickness of the epitaxial films, leading to energy quantization in the lateral directions, provides an additional factor for bandgap engineering, beyond chemical composition and strain along the direction of epitaxial growth. The patterning of superlattice layers into pillars whose cross-section is smaller than relevant coherence lengths, such as the mean free path of the electrons and/or holes in the lateral directions (perpendicular to the direction of epitaxial growth), and the filling of the spaces between the pillars with material(s) that present large potential barriers to electrons and/or holes, confines the charge carriers in the pillars, thereby creating superlattice quantum wires. This allows the bandgap engineering in 3-dimensions, while preserving the 2-terminal character of the devices.

Figure 21A:
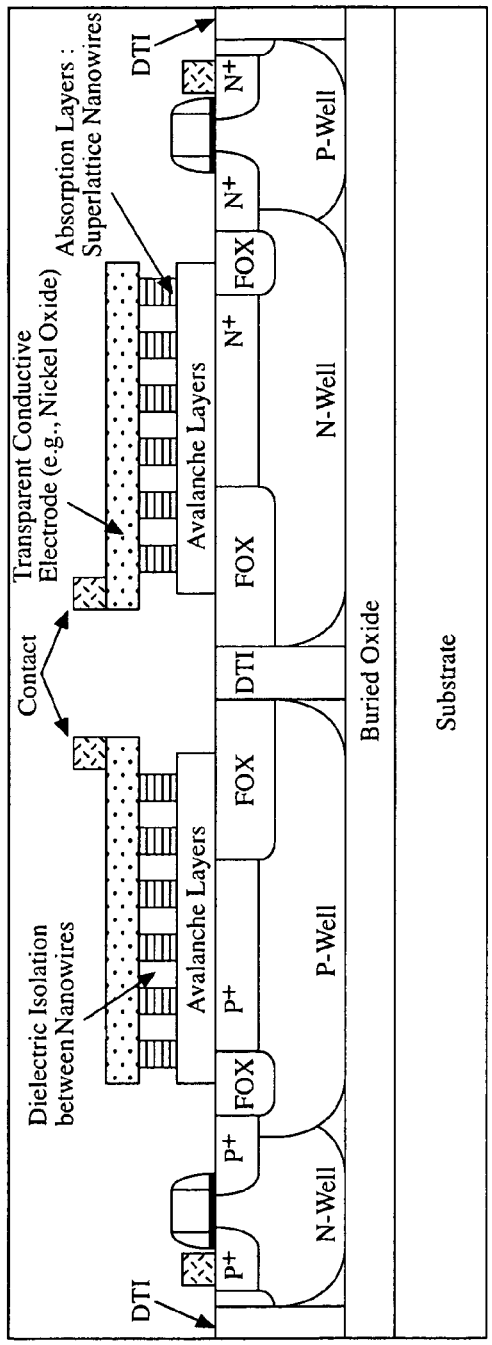
FIG. 21A—Cross sectional view of light-sensing devices, monolithically integrated with CMOS on Thick-Film SOI substrates, with deep trench isolation reaching the buried oxide of the SOI substrate, wherein the superlattice light-absorbing layers are patterned into vertical nanowires, thereby resulting in a 3-dimensional bandgap engineering of the light-absorption layers.

The fabrication of nanowires may involve just the absorption region if the etch step patterns only the absorption layers. FIG. 21A shows a schematic cross-section of a pixel with a superlattice nanowire absorption region.

Figure 21B:
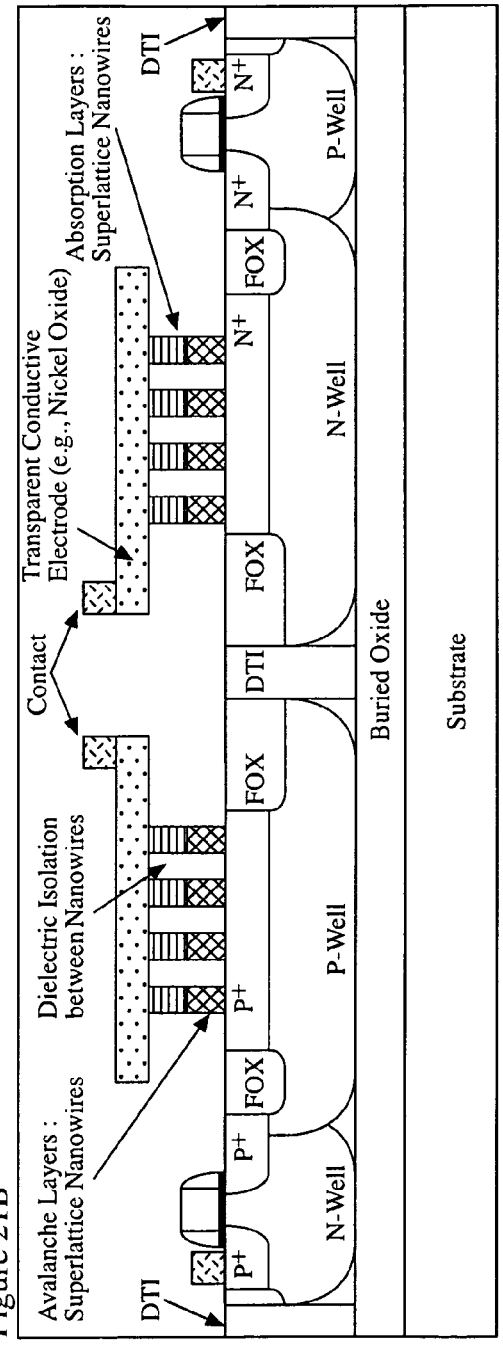
FIG. 21B—Cross sectional view of light-sensing devices, monolithically integrated with CMOS on Thick-Film SOI substrates, with deep trench isolation reaching the buried oxide of the SOI substrate, wherein the superlattice light-absorbing layers and the avalanche multiplication layers, are both patterned into vertical nanowires, thereby resulting in a 3-dimensional bandgap engineering of the light-absorption and avalanche multiplication layers.

The fabrication of nanowires may also involve the multiplication region, if the etch step goes deeper than the absorption region and patterns also the multiplication layers. FIG. 21B shows a schematic cross-section of a pixel with a superlattice nanowire absorption region, and also a bandgap engineered multiplication region.

The bottom electrode of the photo-diode is not affected by whether the top layers are patterned into nanowires or not. However the top electrode, and how to contact it, is highly impacted by the fabrication of nanowires.

After the etching the nanowires, the surface of the side-walls must have low defect concentration, which can be achieved through a combination of damage-less or low-damage etching and/or cycles of low-temperature oxidation and damage-less oxide etch, which can completely remove defective portions of the nanowires. Subsequently, the side-walls of the nanowires are passivated, with conventional methods, such as the low-temperature growth of a thin oxide or oxinitride.

After surface passivation, the space between nanowires is filled with a dielectric such as silicon oxide. A planarization step (for example with Chemical Mechanical Polishing—CMP) can be used to flatten the surface above the nanowires, and expose the top surface of said nanowires. Once the top surface of the nanowires is exposed, a contact to the top of the nanowires can be made with a transparent conductive material, that is compatible with CMOS processing, such as Nickel Oxide. For each photo-diode, comprising several nanowires, the contact is made in parallel to the top of all nanowires.

There is a considerable difference between nanowires made of single material, such as silicon, and the superlattice nanowire of the current invention. The difference is that the former the bandgap engineering is only in 2 dimensions (the dimensions in which there is spatial confinement), while the latter is bandgap engineered also in the third dimension (perpendicular to the substrate) because of the epitaxially grown superlattice layers, before patterning into nanowires. For this reason it is expected that superlattice nanowires have an extra degree of freedom for bandgap engineering and therefore are expected to deliver superior electronic and optoelectronic properties when compared to nanowires made with just one element.

6. Incorporation of HIT Cooler Layers

Co-pending patent application Ser. No. 11/070,721 presented, in FIG. 18, exemplary implementations of Heterojunction Integrated Thermionic (HIT) cooling devices whose layers were formed during the same epitaxial growth step that formed the light-sensing layers, and thus were monolithically integrated with the PIN and HIP types of photo-diodes and CMOS circuitry.

With appropriate SiGeC heterojunction design and suitable mode of operation, a HIT cooler can also operate as a thermoelectric generator. Therefore, the same epitaxially grown device can operated as a cooler or a thermoelectric power generator.

In the present invention, an epitaxial stack comprising photo-diodes layers and cooler/thermoelectric-generator, is grown inside a pixel matrix for image sensing purposes, wherein the cooler/thermoelectric-generator is used to cool down the photo-diodes, and said epitaxial layer is also grown outside the pixel matrix, in regions where CMOS circuitry generates considerable heat, where the cooler/thermoelectric-generator is used to convert the heat generated by the CMOS circuitry into electricity, thus enabling energy recycling or regeneration.

This is accomplished without any additional epitaxial growth steps or any other critical process steps, because the photo-diode layers do not present an appreciable heat barrier, and therefore do not hinder the conversion of heat into electricity.

This configuration is particularly relevant for system-on-chip (SoC) image sensors where powerful digital signal processing (DSP), leads to considerable heat generation. DSP power consumption increases with increased number of pixels, and sophistication of image processing.

The invention claimed is:

1. A light-sensing device comprising a semiconductor substrate and photodiodes formed thereon, wherein the semiconductor substrate includes side-by-side active areas implanted therein, some with n-type doping, others with p-type doping, and CMOS devices, said active areas being electrically isolated from one another and from the adjacent CMOS device by isolation regions (FOX), the photodiodes having a light-sensing region comprising a stack of layers with at least one superlattice region having interleaved well and barrier layers, the photodiodes being formed by alternating pseudomorphic layers under tensile and compressive strain, each layer incorporating Group IV elements and/or alloys thereof, wherein light can be absorbed in a first type of photodiode by the generation of electron-hole pairs through miniband-to-miniband transitions, and in a second type of photodiode by intersubband transitions, the photodiodes of the first and second types share the same set of epitaxial layers on said active areas, wherein when the doping in the epitaxial layers is of the opposite polarity of that in the active area, a photodiode of the first type is formed, and when the doping in the epitaxial layers is of the same polarity of that in the active area, a photodiode of the second type is formed.

2. A light-sensing device as claimed in claim 1, wherein the photodiodes of the first type are grown on active areas having a predetermined first polarity and the photodiodes of the second type being grown on active areas having a second polarity that is opposite to said first polarity.

3. A light-sensing device as claimed in claim 1, wherein the substrate is made of a material selected from the group comprising Silicon Bulk substrates, or Thick-Film Silicon-On-Insulator (SOI), or Thin-Film Silicon-On-Insulator (SOI), or Germanium Bulk substrates, or Thick-Film Germanium (GeOI), or Thin-Film Germanium-On-Insulator (GeOI).

4. A light-sensing device as claimed in claim 1, made on bulk substrates, wherein the active area underneath a photodiode is electrically connected to an adjacent CMOS device on a separate active area, wherein the source/drain regions of said CMOS device have the same polarity of the substrate surface underneath the photodiode epitaxial layers, wherein a portion of the source/drain region of said CMOS device and at least a portion of the substrate underneath said photodiode are electrically connected underneath the isolation region separating the two separate active areas by a well implant of the same polarity, and wherein said well having the same polarity of the substrate, is electrically isolated from said substrate by a deep-well of the opposite polarity.

5. A light-sensing device as claimed in claim 1, made on thick-film SOI substrates, wherein the active area underneath a photodiode is electrically connected to an adjacent CMOS device on a separate active area, wherein the source/drain regions of said CMOS device have the same polarity of the substrate surface underneath the photodiode epitaxial layers, wherein a portion of the source/drain region of said CMOS device and at least a portion of the substrate underneath said photodiode are electrically connected underneath the isolation region separating the two separate active areas by a well implant of the same polarity, and wherein the well implants of both polarities reach the buried oxide of the SOI substrate.

6. A light-sensing device as claimed in claim 5, wherein deep isolation trenches reaching the buried oxide of the SOI substrate provide complete dielectric isolation between adjacent photodiodes and/or CMOS devices.

7. A light-sensing device as claimed in claim 1, wherein the active areas are the bottom electrodes of epitaxially grown photodiodes.

8. A light-sensing device as claimed in claim 1 wherein the light-absorption region comprises a stack of superlattices, such as $(Si_{1-y}C_y)_m$—$(Ge)_n$, or $(Si)_m$—$(Ge_{1-z}C_z)_n$, or $(Si_{1-y}C_y)_m$—$(Ge_{1-z}C_z)_n$, wherein a monotonically varying bandgap is produced by suitable changes in layer composition and/or superlattice periodicity.

9. A light-sensing device as claimed in claim 1 wherein the light-absorption region comprises a stack of superlattices, such as $(Si_{1-y}C_y)_m$—$(Ge)_n$, or $(Si)_m$—$(Ge_{1-z}C_z)_n$, or $(Si_{1-y}$ $C_y)_m$—$(Ge_{1-z}C_z)_n$, wherein a monotonically varying gap between subbands is produced by suitable changes in layer composition and/or superlattice periodicity.

10. A light-sensing device as claimed in claim 1 wherein the light-absorption region comprises a stack of superlattices, such as $(Si_{1-y}C_y)_m$—$(Ge)_n$, or $(Si)_m$—$(Ge_{1-z}C_z)_n$, or $(Si_{1-y}C_y)_m$—$(Ge_{1-z}C_z)_n$, for photo-sensing through intersubband transitions with the same polarity of the active area underneath the epitaxial layers, and wherein the interface between the superlattice with the smallest bandgap and the layer underneath it, provides a barrier for lowest energy subbands, while allowing transport perpendicular to said interface of carriers that have been photo-excited.

11. A light-sensing device as claimed in claim 1, wherein the bottom electrode and the epitaxial layers comprising a middle region and a top electrode, form devices operating in avalanche mode, such as Avalanche Photo-Diodes diodes.

12. A light-sensing device as claimed in claim 1, wherein the region between the bottom electrode and the absorption layer is a bandgap and doping engineered avalanche multiplication region.

13. A light-sensing device as claimed in claim 12, wherein the avalanche multiplication region comprises at least one superlattice.

14. A light-sensing device as claimed in claim 12, wherein the avalanche multiplication region comprises doping impurities with deep energy levels in the bandgap of silicon, such as Indium and Tellurium.

15. A light-sensing device as claimed in claim 1, wherein the light absorption layers are patterned to form vertical nanowires, with dielectric isolation between said nanowires, with a contact to the top of said nanowires formed by a transparent conductive material.

16. A light-sensing device as claimed in claim 12, wherein the avalanche multiplication layers are patterned into vertical nanowires, with dielectric isolation between said nanowires.

17. A light-sensing device as claimed in claim 1, further comprising at least one heterojunction thermal device, fabricated with the same single epitaxial growth used for forming the photodiodes of the first and second types of photodiodes, wherein said heterojunction thermal device can be operated as a Heterojunction Integrated Thermionic (HIT) cooler device or as a thermoelectric power generator device.

18. A light-sensing device comprising a semiconductor substrate and photodiodes formed thereon, wherein the semiconductor substrate includes side-by-side active areas implanted therein, some with n-type doping, others with p-type doping, and CMOS devices, said active areas being electrically isolated from one another and from the adjacent CMOS device by isolation regions (FOX), the photodiodes having a light-sensing region comprising a stack of layers with at least one superlattice region having interleaved well and barrier layers, the photodiodes being formed by alternating pseudomorphic layers under tensile and compressive strain, each layer incorporating Group IV elements and/or alloys thereof, wherein light can be absorbed in a first type of photodiode by the generation of electron-hole pairs through miniband-to-miniband transitions, and in a second type of photodiode by intersubband transitions, the photodiodes of the first and second types share the same set of epitaxial layers on said active areas, wherein when the doping in the epitaxial layers is of the opposite polarity of that in the active area, a photodiode of the first type is formed, and when the doping in the epitaxial layers is of the same polarity of that in the active area, a photodiode of the second type is formed.

19. A light-sensing device as claimed in claim 18, wherein the Group IV elements and alloys thereof are selected from the group consisting of Si, Ge, C, $(Si_{1-y}C_y)$, $(Ge_{1-z}C_z)$, and $(Si_{1-x-y}Ge_xC_y)$ random alloys, wherein the photodiodes of the first type are grown on active areas having a predetermined first polarity and the photodiodes of the second type being grown on active areas having a second polarity that is opposite to said first polarity.

20. A light-sensing device as claimed in claim 18, wherein the substrate is made of a material selected from the group comprising Silicon Bulk substrates, or Thick-Film Silicon-On-Insulator (SOI), or Thin-Film Silicon-On-Insulator (SOI), or Germanium Bulk substrates, or Thick-Film Germanium (GeOI), or Thin-Film Germanium-On-Insulator (GeOI).

* * * * *